(12) United States Patent
Sakai et al.

(10) Patent No.: US 10,283,434 B2
(45) Date of Patent: May 7, 2019

(54) ELECTRONIC DEVICE, METHOD FOR MANUFACTURING THE ELECTRONIC DEVICE, AND ELECTRONIC APPARATUS

(71) Applicant: FUJITSU LIMITED, Kawasaki-shi, Kanagawa (JP)

(72) Inventors: Taiji Sakai, Yokohama (JP); Seiki Sakuyama, Yamato (JP); Nobuhiro Imaizumi, Atsugi (JP); Aki Dote, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/299,339

(22) Filed: Oct. 20, 2016

(65) Prior Publication Data

US 2017/0125359 A1 May 4, 2017

(30) Foreign Application Priority Data

Nov. 4, 2015 (JP) .................................. 2015-216323

(51) Int. Cl.
*H01L 21/00* (2006.01)
*H01L 29/40* (2006.01)
(Continued)

(52) U.S. Cl.
CPC ........ *H01L 23/4012* (2013.01); *H01L 23/562* (2013.01); *H01L 24/11* (2013.01); *H01L 24/13* (2013.01); *H01L 24/14* (2013.01); *H01L 24/17* (2013.01); *H01L 24/81* (2013.01); *H01L 24/92* (2013.01); *H01L 24/98* (2013.01); *H01L 25/043* (2013.01); *H01L 25/0657* (2013.01);
(Continued)

(58) Field of Classification Search
CPC ....................... H01L 23/4012; H01L 25/0657
USPC .................. 257/686, 777–778; 438/107–109
See application file for complete search history.

(56) References Cited

U.S. PATENT DOCUMENTS 6,869,827 B2 * 3/2005 Vaiyapuri ............. H01L 21/563
257/723
8,102,663 B2 * 1/2012 Cunningham .......... H01L 23/48
361/760

(Continued)

FOREIGN PATENT DOCUMENTS

| JP | 2001-284520 | 10/2001 |
| JP | 2006-261311 | 9/2006 |
| JP | 2011-44654 | 3/2011 |

OTHER PUBLICATIONS

JPOA—Office Action of Japanese Patent Application No. 2015-216323 dated Mar. 19, 2019 with machine English translation.

*Primary Examiner* — Calvin Lee
(74) *Attorney, Agent, or Firm* — Fujitsu Patent Center

(57) ABSTRACT

An electronic device includes: a first circuit board; a second circuit board located above a first region of the first circuit board; a first semiconductor element located above a second region of the first circuit board, which is different from the first region, and above a third region of the second circuit board; a first connection interposed between the first semiconductor element and the second region so as to electrically interconnect the first semiconductor element and the first circuit board; and a second connection interposed between the first semiconductor element and the third region so as to electrically interconnect the first semiconductor element and the second circuit board.

9 Claims, 29 Drawing Sheets

(51) Int. Cl.
*H01L 23/40* (2006.01)
*H01L 25/04* (2014.01)
*H01L 25/065* (2006.01)
*H01L 25/075* (2006.01)
*H01L 25/11* (2006.01)
*H01L 23/00* (2006.01)
*H05K 1/00* (2006.01)

(52) U.S. Cl.
CPC ........ H01L 25/0756 (2013.01); H01L 25/117 (2013.01); H05K 1/00 (2013.01); *H01L 24/03* (2013.01); *H01L 24/05* (2013.01); *H01L 24/16* (2013.01); *H01L 24/32* (2013.01); *H01L 24/83* (2013.01); *H01L 2224/034* (2013.01); *H01L 2224/03912* (2013.01); *H01L 2224/05083* (2013.01); *H01L 2224/05084* (2013.01); *H01L 2224/05144* (2013.01); *H01L 2224/05147* (2013.01); *H01L 2224/05155* (2013.01); *H01L 2224/05164* (2013.01); *H01L 2224/1147* (2013.01); *H01L 2224/11334* (2013.01); *H01L 2224/11462* (2013.01); *H01L 2224/11849* (2013.01); *H01L 2224/131* (2013.01); *H01L 2224/13111* (2013.01); *H01L 2224/13147* (2013.01); *H01L 2224/1403* (2013.01); *H01L 2224/14051* (2013.01); *H01L 2224/14131* (2013.01); *H01L 2224/14134* (2013.01); *H01L 2224/14177* (2013.01); *H01L 2224/14505* (2013.01); *H01L 2224/16145* (2013.01); *H01L 2224/16227* (2013.01); *H01L 2224/1703* (2013.01); *H01L 2224/17051* (2013.01); *H01L 2224/17134* (2013.01); *H01L 2224/17177* (2013.01); *H01L 2224/17505* (2013.01); *H01L 2224/32225* (2013.01); *H01L 2224/73204* (2013.01); *H01L 2224/81011* (2013.01); *H01L 2224/81024* (2013.01); *H01L 2224/81065* (2013.01); *H01L 2224/81143* (2013.01); *H01L 2224/81191* (2013.01); *H01L 2224/81193* (2013.01); *H01L 2224/81444* (2013.01); *H01L 2224/81447* (2013.01); *H01L 2224/81815* (2013.01); *H01L 2224/81907* (2013.01); *H01L 2224/8385* (2013.01); *H01L 2224/83192* (2013.01); *H01L 2224/9205* (2013.01); *H01L 2224/9211* (2013.01); *H01L 2924/15311* (2013.01); *H01L 2924/3511* (2013.01)

(56) References Cited

U.S. PATENT DOCUMENTS 9,780,072 B2* 10/2017 Jeng .................... H01L 25/0652
2006/0151206 A1* 7/2006 Maruyama ........ H01L 23/49833
174/260
2006/0226527 A1 10/2006 Hatano et al.

\* cited by examiner

ELECTRONIC DEVICE, METHOD FOR MANUFACTURING THE ELECTRONIC DEVICE, AND ELECTRONIC APPARATUS

CROSS-REFERENCE TO RELATED APPLICATION

This application is based upon and claims the benefit of priority of the prior Japanese Patent Application No. 2015-216323, filed on Nov. 4, 2015, the entire contents of which are incorporated herein by references.

FIELD

The embodiments discussed herein are related to an electronic device, a method for manufacturing the electronic device, and an electronic apparatus.

BACKGROUND

Regarding an electronic device including semiconductor elements, a technique for mounting a semiconductor element such as, for example, a central processing unit (CPU) or a memory, above a predetermined circuit board via a relay board (circuit board) such as, for example, an interposer is known.

In the electronic device employing such a technique, when power is supplied from a predetermined circuit board to the semiconductor element through the relay board, a sufficient current density may not be obtained due to the relay board so that desired power may not be supplied to the semiconductor element. In addition, when signal transmission is performed between the predetermined circuit board and the semiconductor element through the relay board, a delay or loss in the signal transmission may occur due to the interposed relay board. When such things occur, the performance of the semiconductor element may not be sufficiently exhibited.

The followings are reference documents.
[Document 1] Japanese Laid-Open Patent Publication No. 2001-284520 and
[Document 2] Japanese Laid-Open Patent Publication No. 2011-44654.

SUMMARY

An electronic device includes: a first circuit board; a second circuit board located above a first region of the first circuit board; a first semiconductor element located above a second region of the first circuit board, which is different from the first region, and above a third region of the second circuit board; a first connection interposed between the first semiconductor element and the second region so as to electrically interconnect the first semiconductor element and the first circuit board; and a second connection interposed between the first semiconductor element and the third region so as to electrically interconnect the first semiconductor element and the second circuit board.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
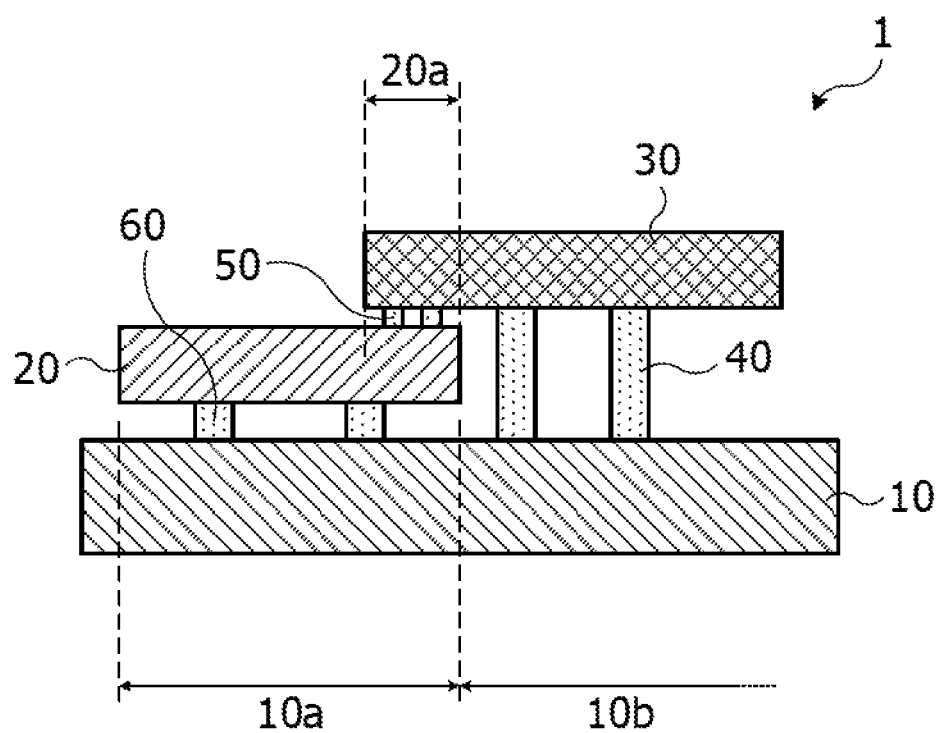
FIG. 1 is a view illustrating one example of an electronic device according to a first embodiment (Part 1)
Figure 2:
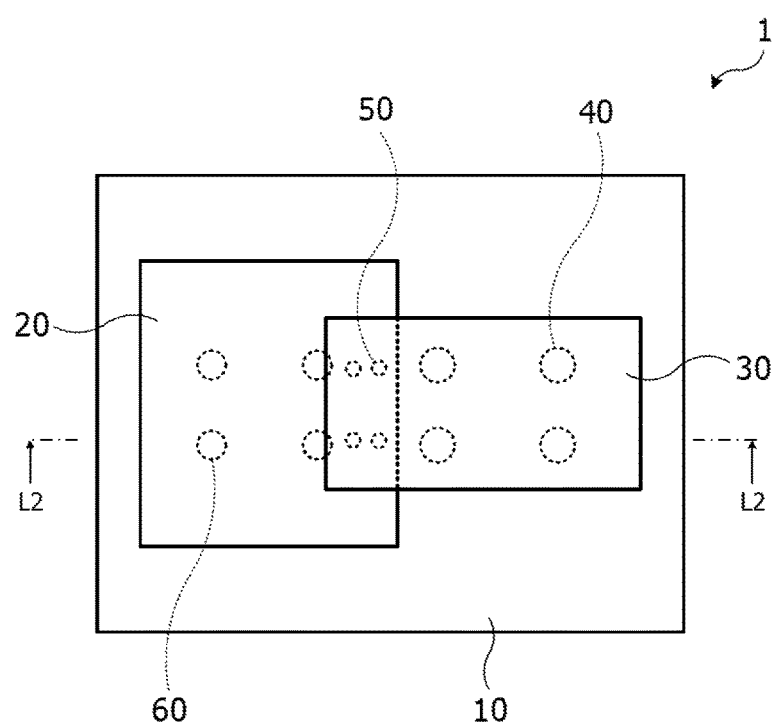
FIG. 2 is a view illustrating one example of the electronic device according to the first embodiment (Part 2)

First, a first embodiment will be described.
FIGS. 1 and 2 are views illustrating one example of an electronic device according to a first embodiment. FIG. 1 is a schematic cross-sectional view of main parts of one example of the electronic device according to the first embodiment. FIG. 2 is a schematic plan view of the main parts of one example of the electronic device according to the first embodiment. FIG. 1 schematically illustrates a section taken along line L2-L2 in FIG. 2.

An electronic device 1 illustrated in FIGS. 1 and 2 includes a circuit board 10, a circuit board 20, and a semiconductor element 30.

Various circuit boards provided with conductor patterns including electrodes, wirings, vias and the like formed on the surfaces thereof and in the inside thereof are used for the circuit board 10. For example, a printed circuit board including an insulating part made of an organic material, an inorganic material, a ceramic material, or the like is used as the circuit board 10.

Various circuit boards having conductor patterns including electrodes, wirings, vias and the like formed on the surfaces thereof and in the inside thereof are used for the circuit board 20. The circuit board 20 is interposed between the circuit board 10 and the semiconductor element 30 so as to electrically interconnect, for example, the circuit board 10 and the semiconductor element 30, which have different terminal pitches. The circuit board 20 is formed with a conductor pattern which is denser than the circuit board 10. The circuit board 20 is a relay board interposed between the circuit board 10 and the semiconductor element 30. For example, an interposer or a printed circuit board including a substrate made of silicon (Si), glass or organic material is used as the circuit board 20.

The circuit board 20 is located above a region 10a of the circuit board 10. For example, the circuit board 20 is electrically connected with the circuit board 10 by at least one (in this example, two in the cross-sectional view and four in the plan view) connection 60 interposed between the region 10a of the circuit board 10 and the circuit board 20.

Various semiconductor elements including circuit elements such as transistors, resistors, capacitors, and the like are used for the semiconductor element 30. For example, a processor such as a CPU, a micro processing unit (MPU), or a graphics processing unit (GPU) or the like is used as the semiconductor element 30.

The semiconductor element 30 is located above a region 10b different from the region 10a of the circuit board 10 and a region 20a of the circuit board 20. That is, the semiconductor element 30 is located above the circuit board 10 so as to partially overlap with the region 20a of the circuit board 20. The semiconductor element 30 is electrically connected with the circuit board 10 by at least one (in this example, two in the cross-sectional view and four in the plan view) connection 40 interposed between the region 10b of the circuit board 10 and the semiconductor element 30. The semiconductor element 30 is also electrically connected with the circuit board 20 by at least one (in this example, two in the cross-sectional view and four in the plan view) connection 50 interposed between the region 20a of the circuit board 20 and the semiconductor element 30.

In addition, another semiconductor element may be stacked above the semiconductor element 30 so as to be electrically connected with the semiconductor element 30.

As described above, in the electronic device 1, the semiconductor element 30 electrically connected with the circuit board 20 by the connection 50 is electrically connected with the circuit board 10 directly by the connection 40 without going through the circuit board 20.

Here, the size (e.g., wiring width or via diameter) of the conductor pattern of the circuit board 20 may be restricted by, for example, materials of the circuit board 20, a method of manufacturing the circuit board 20, or terminal pitches of the circuit board 10 and the semiconductor element 30. On the other hand, the connection 40 electrically connecting the semiconductor element 30 and the circuit board 10 to each other may be set to any size (for example, a diameter) independently of the conductor pattern of the circuit board 20.

For example, when it is impossible to form a via of a certain diameter or more, as the conductor pattern, in the circuit board 20, in the configuration of supplying power from the circuit board 10 to the semiconductor element 30 through the circuit board 20, the power may be insufficient and a desired operation may not be executed in the semiconductor element 30.

In contrast, in the electronic device 1, the diameter of the connection 40 may be set based on power required to cause the semiconductor element 30 to perform a desired operation. According to the electronic device 1, sufficient power may be supplied from the circuit board 10 to the semiconductor element 30 through the connection 40 and the semiconductor element 30 may be caused to execute the desired operation.

The electronic device 1 may be configured in a form that signal transmission may be performed between the circuit board 10 and the semiconductor element 30.

Here, in the circuit board 20 interposed between the semiconductor element 30 and the circuit board 10 that have different pitches of terminals (the connections 50 and 60), wirings communicating to the terminals, lands of the communicating wirings, and vias that connect upper and lower wirings (lands) are formed. Therefore, when the signal transmission is performed between the semiconductor element 30 and the circuit board 10 via the circuit board 20, a transmission distance may be increased or a transmission path including a bent portion may become complicated, which may result in a delay or loss of the transmission signals.

In contrast, in the electronic device 1, the signal transmission between the circuit board 10 and the semiconductor element 30 may be performed directly through the connection 40 without going through the circuit board 20. Therefore, the delay or loss of transmission signals which may occur in the signal transmission via the circuit board 20 may be suppressed, thus facilitating the signal transmission between the circuit board 10 and the semiconductor element 30.

With the above configuration, the electronic device 1 capable of sufficiently exhibiting the performance of the semiconductor element 30 may be achieved.

Figure 3:
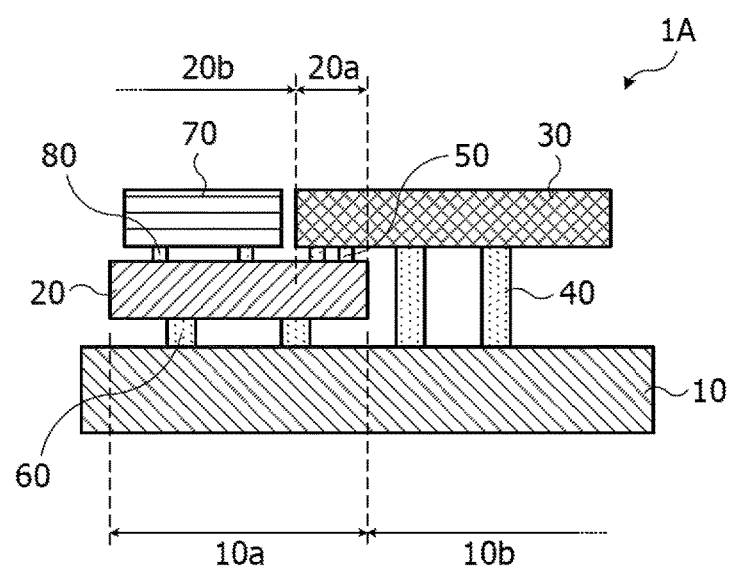
FIG. 3 is a view illustrating another example of the electronic device according to the first embodiment (Part 1)

FIG. 3 is a view illustrating another example of the electronic device according to the first embodiment. FIG. 3 is a schematic cross-sectional view of main parts of another example of the electronic device according to the first embodiment.

An electronic device 1A illustrated in FIG. 3 is different from the above-described electronic device 1 in that the former further includes a semiconductor element 70.

Various semiconductor elements including circuit elements such as, for example, transistors are used for the semiconductor element 70. For example, a memory such as, for example, a dynamic random access memory (DRAM), a static random access memory (SRAM), a flash memory or the like, or a processor such as a CPU is used as the semiconductor element 70.

The semiconductor element 70 is located above a region 20b that is different from the region 20a of the circuit board 20. The semiconductor element 70 is electrically connected with the circuit board 20 by at least one (in this example, two in the cross-sectional view) connection 80 interposed between the region 20b of the circuit board 20 and the semiconductor element 70.

The semiconductor element 70 connected to the region 20b of the circuit board 20 by the connection 80 and the semiconductor element 30 connected to the region 20a of the circuit board 20 by the connection 50 are electrically interconnected by the conductor pattern formed on the circuit board 20.

In addition, another semiconductor element may be stacked above the semiconductor element 70 so as to be electrically connected with the semiconductor element 70. In addition, a further semiconductor element or a group of staked semiconductor elements may be located above the circuit board 20, specifically above a region different from the arrangement region (the region 20b) of the semiconductor element 70, in addition to the semiconductor element 70.

The electronic device 1A exhibits the same effects as the above-described electronic device 1 which are obtained when the semiconductor element 30 is electrically connected with the circuit board 10 directly by the connection 40 without going through the circuit board 20.

In the electronic device 1A, for example, supply of power from the circuit board 10 to the semiconductor element 30 is performed through the connection 40 and signal transmission between the semiconductor element 30 and the semiconductor element 70 is performed through the circuit board 20. In this case, the connection 40 may be set to a size (e.g., a diameter) suitable for the supply of power from the circuit board 10 to the semiconductor element 30. A conductor pattern of a shape, a size (e.g., a wiring width or via diameter) and density suitable for the signal transmission between the semiconductor element 30 and the semiconductor element 70 may be formed on the circuit board 20.

With the above configuration, the electronic device 1A capable of sufficiently exhibiting the performance of the semiconductor element 30 or the performance of the semiconductor element 30 and semiconductor element 70 may be achieved.

Figure 4:
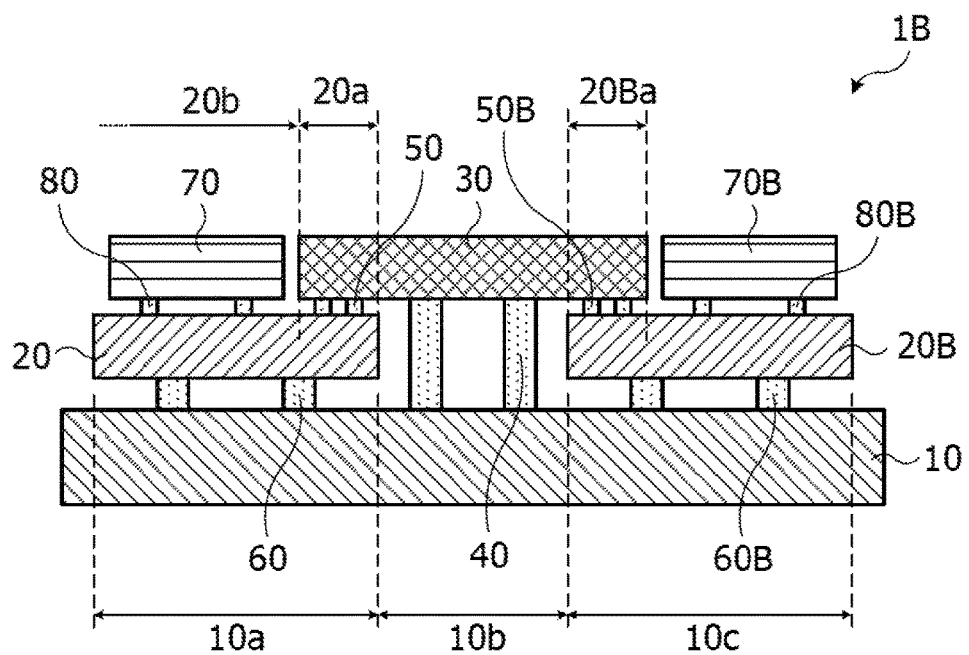
FIG. 4 is a view illustrating another example of the electronic device according to the first embodiment (Part 2)
Figure 5:
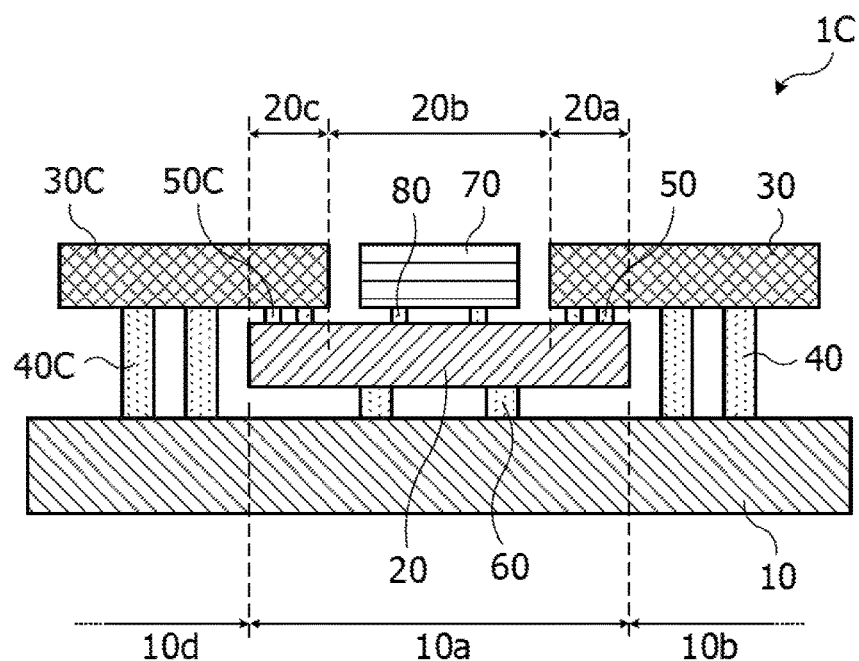
FIG. 5 is a view illustrating another example of the electronic device according to the first embodiment (Part 3)

FIGS. 4 and 5 are views illustrating other examples of the electronic device according to the first embodiment. FIGS. 4 and 5 are schematic cross-sectional views of main parts of the other examples of the electronic device according to the first embodiment.

An electronic device 1B illustrated in FIG. 4 includes the circuit board 10, the circuit board 20, the semiconductor element 30, and a circuit board 20B (relay board) located above a region 10c of the circuit board 10. The circuit board 20B is electrically connected with the circuit board 10 by at least one (in this example, two in the cross-sectional view) connection 60B.

In the electronic device 1B, the semiconductor element 30 is located above the region 10b of the circuit board 10, the region 20a of the circuit board 20 and a region 20Ba of the circuit board 20B. That is, the semiconductor element 30 is located above the circuit board 10 so as to partially overlap with the region 20a of the circuit board 20 and partially overlap with the region 20Ba of the circuit board 20B. In the electronic device 1B, the semiconductor element 30 is electrically connected with the circuit board 20 by the connection 50, and electrically connected with the circuit board 20B by a connection 50B while being electrically connected with the circuit board 10 directly by the connection 40.

In the electronic device 1B, separate semiconductor elements may be mounted above the circuit board 20 and the circuit board 20B. FIG. 4 illustrates that the semiconductor element 70 and a semiconductor element 70B are mounted above the circuit board 20 and the circuit board 20B, respectively. The semiconductor element 70 is electrically connected with the circuit board 20 by the connection 80 and the semiconductor element 70B is electrically connected with the circuit board 20B by a connection 80B. The semiconductor element 70 and the semiconductor element 30 are electrically interconnected through the circuit board 20 and the semiconductor element 70B and the semiconductor element 30 are electrically interconnected through the circuit board 20B.

In addition, another semiconductor element may be stacked above the semiconductor element 30, the semiconductor element 70, or the semiconductor element 70B. In addition, a further semiconductor element or a group of staked semiconductor elements may be located above a region of the circuit board 20, which is different from the arrangement region of the semiconductor element 70, or a region of the circuit board 20B, which is different from the arrangement region of the semiconductor element 70B.

The electronic device 1B as configured above may obtain the same effects as described for the electronic devices 1 and 1A. With the above configuration, the electronic device 1B capable of sufficiently exhibiting the performance of the semiconductor element 30, or the performance of the semiconductor element 30 and semiconductor element 70, or the performance of the semiconductor element 30, semiconductor element 70 and semiconductor element 70B may be achieved.

An electronic device 1C illustrated in FIG. 5 includes the circuit board 10, the circuit board 20, the semiconductor element 30 and a semiconductor element 30C.

The semiconductor element 30C is located above a region 10d of the circuit board 10 and a region 20c of the circuit board 20. That is, the semiconductor element 30C is located above the circuit board 10 so as to partially overlap with the region 20c of the circuit board 20. The semiconductor element 30C is electrically connected with the circuit board 10 by at least one (in this example, two in the cross-sectional view) connection 40C interposed between the region 10d of the circuit board 10 and the semiconductor element 30C. The semiconductor element 30C is electrically connected with the circuit board 20 by at least one (in this example, two in the cross-sectional view) connection 50C interposed between the region 20c of the circuit board 20 and the semiconductor element 30C.

In the electronic device 1C, separate semiconductor elements may be mounted above the circuit board 20. FIG. 5 illustrates that the semiconductor element 70 is mounted above the circuit board 20. The semiconductor element 70 is electrically connected with the circuit board 20 by the connection 80. The semiconductor element 30 and the semiconductor element 70 are electrically interconnected through the circuit board 20 and the semiconductor element 30C and the semiconductor element 70 are electrically interconnected through the circuit board 20.

In addition, another semiconductor element may be stacked above the semiconductor element 30, the semiconductor element 30C or the semiconductor element 70. In addition, a further semiconductor element or a group of staked semiconductor elements may be located above a region of the circuit board 20, which is different from the arrangement region of the semiconductor element 70.

The electronic device 1C as configured above may obtain the same effects as described for the electronic devices 1 and 1A. With the above configuration, the electronic device 1C capable of sufficiently exhibiting the performance of the semiconductor element 30 and semiconductor element 30C, or the performance of the semiconductor element 30, semiconductor element 30C and semiconductor element 70 may be achieved.

Next, a second embodiment will be described.

Here, an electronic device including a processor and a memory as semiconductor elements will be described as a second embodiment.

Prior to the description on an electronic device according to the second embodiment, an electronic device having a configuration as illustrated in FIGS. 6A and 6B and 7A and 7B will first be described.

Figure 6A:
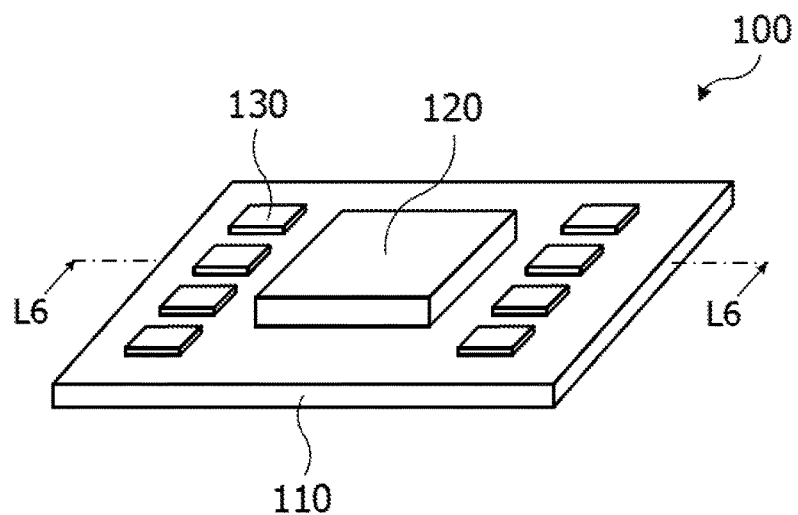
FIGS. 6A and 6B are views illustrating one example of an electronic device.
Figure 6B:
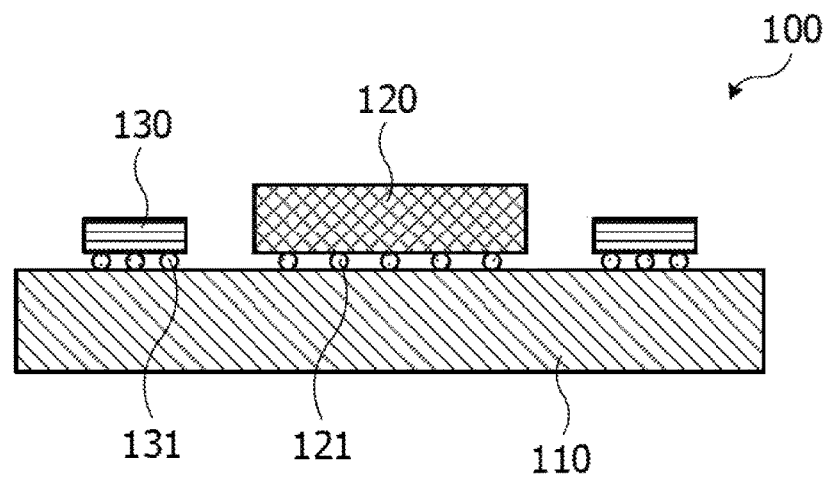

FIGS. 6A and 6B are views illustrating one example of an electronic device. FIG. 6A is a schematic perspective view of main parts of one example of the electronic device and FIG. 6B is a schematic cross-sectional view of main parts of one example of the electronic device. FIG. 6B schematically illustrates a section taken along line L6-L6 in FIG. 6A.

The electronic device 100 illustrated in FIGS. 6A and 6B includes a printed circuit board 110, and further includes a processor 120 and a memory 130, which are located above the printed circuit board 110. Here, as one example, one processor 120 and a plurality of memories 130 are illustrated. The processor 120 is electrically connected with the printed circuit board 110 by a connection 121 such as, for example, a solder. Similarly, the memories 130 are electrically connected with the printed circuit board 110 by a connection 131 such as, for example, a solder. In the electronic device 100, power is supplied from the printed circuit board 110 to the processor 120 and signal transmission is performed between the processor 120 and the memories 130 through the printed circuit board 110.

For example, there is a demand for an electronic apparatus to expand a band width between a processor and a memory and enhance data processing capability, thus achieving high performance. However, in the electronic device 100, since there is a limitation in wiring density which may be achieved with the printed circuit board 110, it may be difficult to increase a band width with the increase in a bus width (multiplexed bus) and achieve high performance of the electronic device 100 and an electronic apparatus including the same.

In addition, there is a demand for an electronic apparatus to achieve low power consumption in addition to the demand of high performance.

Figure 7A:
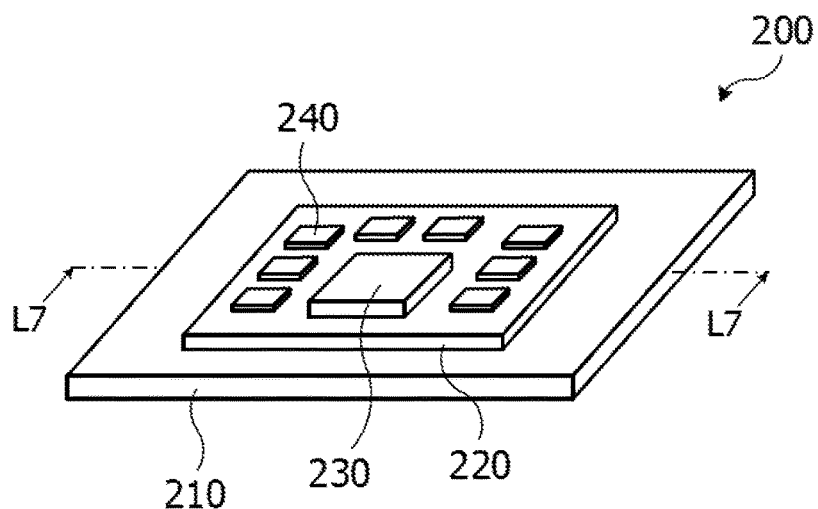
FIGS. 7A and 7B are views illustrating another example of the electronic device.
Figure 7B:
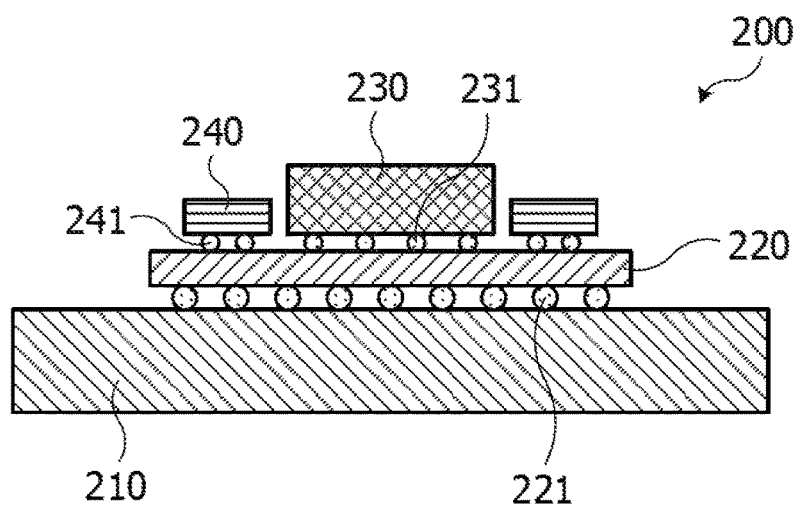

FIGS. 7A and 7B are views illustrating another example of the electronic device. FIG. 7A is a schematic perspective view of main parts of another example of the electronic device and FIG. 7B is a schematic cross-sectional view of main parts of another example of the electronic device. FIG. 7B schematically illustrates a section taken along line L7-L7 in FIG. 7A.

The electronic device 200 illustrated in FIGS. 7A and 7B includes a printed circuit board 210 and an interposer 220 located above the printed circuit board 210, and further includes a processor 230 and a memory 240, which are located above the interposer 220. Here, as one example, one processor 230 and a plurality of memories 240 are illustrated.

The interposer 220 is electrically connected with the printed circuit board 210 by a connection 221 such as a solder or the like. The processor 230 is electrically connected with the interposer 220 by a connection 231 such as a solder or the like. Similarly, the memories 240 are electrically connected with the interposer 220 by a connection 241 such as, for example, a solder. In the electronic device 200, power is supplied from the printed circuit board 210 to the processor 230 through the interposer 220 and signal transmission is performed between the processor 230 and the memories 240 through the interposer 220.

For low power consumption of the electronic device 200 and an electronic apparatus including the same, it is effective to reduce a transmission loss by connecting the processor 230 and the memories 240 by a short distance by increasing a bus width between them. The interposer 220 using Si or glass as a base material may achieve a relatively high wiring density which is 25 times as high as that of a printed circuit board. The use of the interposer 220 facilitates the increase in bus width between the processor 230 and the memories 240 and connection between them by a short distance, which may result in reduction in a transmission loss.

However, in the electronic device 200 in which the processor 230 is mounted on the interposer 220 in this manner, there is a possibility that sufficient power may not be supplied from the printed board 210 to the processor 230. For example, when Si is used for the base material of the interposer 220 and copper (Cu) is used for a conductor, a stress may occur due to mismatch in coefficient of thermal expansion between Si and Cu, thereby making it difficult to form a large-diameter via in the interposer 220. In such an interposer 220, a current density required to cause the processor 230 to execute a desired operation may not be obtained and sufficient power may not be supplied to the processor 230 so that the processor 230 may not execute a desired operation.

In addition, the interposer 220 on which both of the processor 230 and memories 240 are mounted has a relatively large area (planar size). Therefore, there may occur a problem in that a warpage occurring due to a difference in coefficient of thermal expansion between the interposer 220 and the printed circuit board 210 may increase and hence defective bonding may be caused due to the warpage that has occurred, as will be described in detail later. Moreover, the interposer 220 having a large area has a risk to reduce a production yield, as compared to one having a small area.

Figure 8:
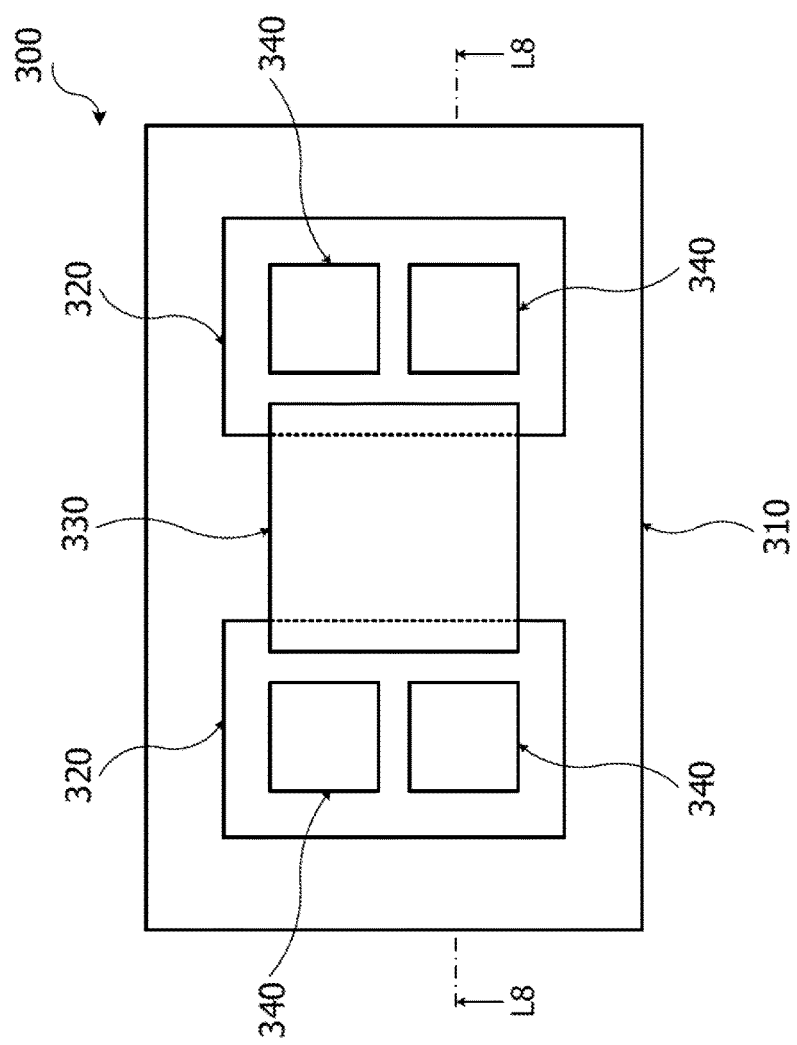
FIG. 8 is a view illustrating one example of an electronic device according to a second embodiment (Part 1)
Figure 9:
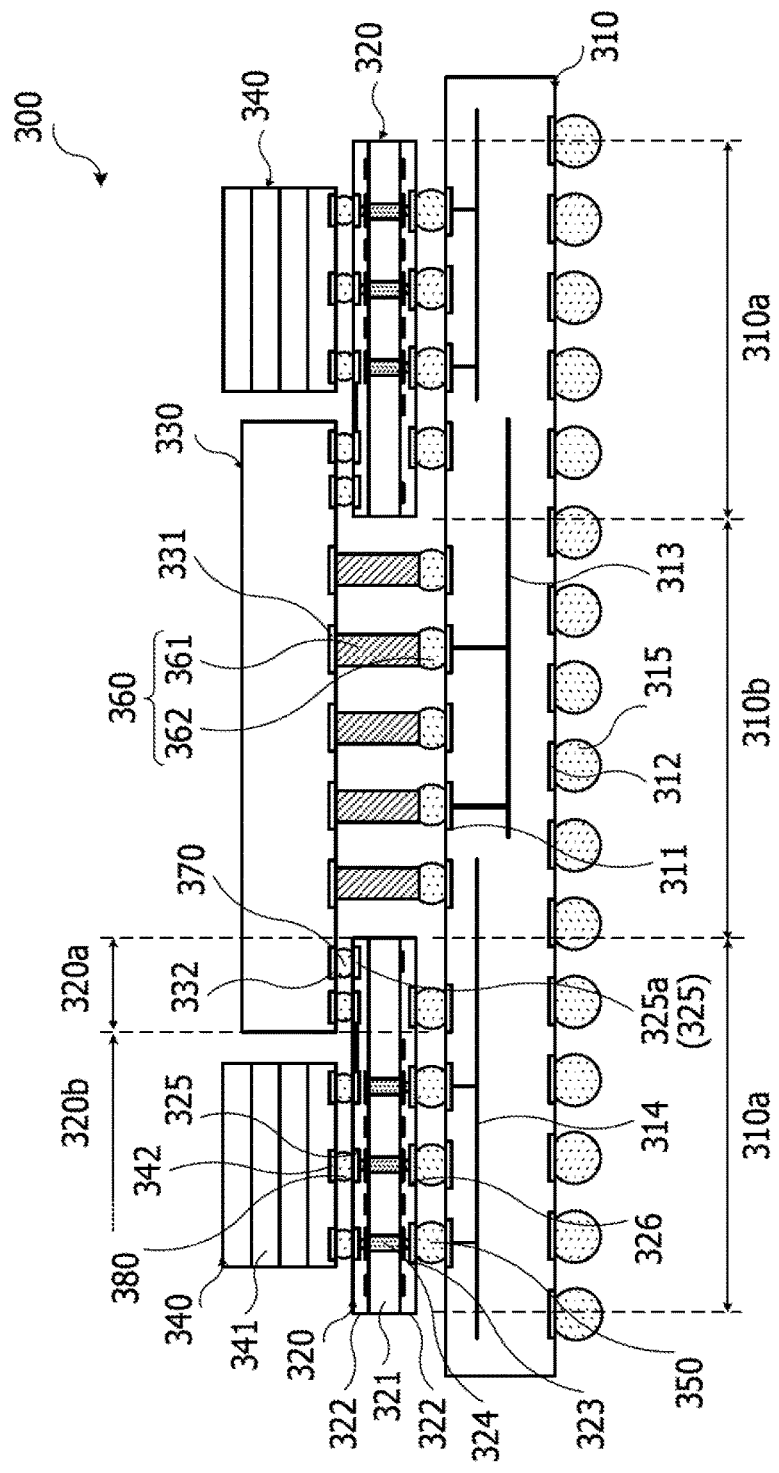
FIG. 9 is a view illustrating one example of the electronic device according to the second embodiment (Part 2)

In consideration of these problems, an electronic device according to the second embodiment employs a configuration as illustrated in FIGS. 8 and 9.

FIGS. 8 and 9 are views illustrating one example of an electronic device according to the second embodiment. FIG. 8 is a schematic plan view illustrating main parts of one example of the electronic device according to the second embodiment. FIG. 9 is a schematic cross-sectional view illustrating the main parts of one example of the electronic device according to the second embodiment. FIG. 9 schematically illustrates a section taken along line L8-L8 in FIG. 8.

The electronic device 300 illustrated in FIGS. 8 and 9 includes a printed circuit board 310, an interposer (relay board) 320, a processor 330, and a memory 340. Here, one processor 330 and a plurality of memories (three dimensional (3D) memories) 340 each including a plurality of (in this example, four) memory chips 341 stacked using a 3D stacking technology are illustrated. In addition, here, a plurality of (in this example, two) interposers 320 and a plurality of (in this example, two for each interposer 320, four in total) memories 340 are illustrated. The plurality of interposers 320 may be similar to or different from each other. In addition, the plurality of memories 340 may be similar to or different from each other.

The printed circuit board 310 includes a plurality of electrodes (pads) 311 formed on the front surface of the printed circuit board 310, and a plurality of electrodes (pads) 312 formed on the rear surface of the printed circuit board 310, and further includes a power line 313 and a signal line 314 which are located inside the printed circuit board 310. The power line 313 and the signal line 314 are electrically connected with at least some electrodes 311 and electrodes 312. Bumps 315 using, e.g., a solder are located on the electrodes 312 formed on the rear surface.

The interposer 320 includes a base member 321 and wiring layers 322 formed respectively on the front and rear surfaces of the base member 321. The base member 321 has vias (via electrodes) 324 formed to penetrate through the base member 321. Conductors 323 including wirings and vias are respectively formed in the wiring layers 322 on the front and rear surfaces of the base member 321. At least some conductors 323 (wiring land portions) in the wiring layers 322 on the front and rear surfaces of the base member 321 are electrically interconnected by the vias 324 penetrating through the base member 321. In addition, electrodes (pads) 325 and electrodes (pads) 326 are respectively formed in the wiring layers 322 on the front and rear surfaces of the base member 321.

The interposer 320 is located above a region 310a of the printed circuit board 310. The electrodes 326 on the rear surface of the interposer 320 are formed at positions corresponding to the electrodes 311 of the region 310a of the printed circuit board 310. The electrodes 326 on the rear surface of the interposer 320 and the electrodes 311 of the region 310a of the printed circuit board 310 are electrically interconnected by a connection 350. The connection 350 includes, e.g., a solder for bonding the electrodes 326 on the rear surface of the interposer 320 and the electrodes 311 of the region 310a of the printed circuit board 310 together.

The processor 330 has circuit elements such as transistors (not illustrated), and a plurality of electrodes (pads) 331 and electrodes (pads) 332 electrically connected with the circuit elements. The electrodes 331 are formed inwards from an end portion of the processor 330 and the electrodes 332 are formed in the end portion of the processor 330.

The processor 330 is located above a region 310b of the printed circuit board 310 and a region 320a of the interposer 320. The electrodes 331 of the processor 330 are formed at positions corresponding to the electrodes 311 of the region 310b of the printed circuit board 310. The electrodes 332 of the processor 330 are formed at positions corresponding to the electrodes 325 (325a) on the front surface of the region 320a of the interposer 320. The electrodes 331 of the processor 330 and the electrodes 311 of the region 310b of the printed circuit board 310 are electrically interconnected by a connection 360. The electrodes 332 of the processor 330 and the electrodes 325a of the region 320a of the interposer 320 are electrically interconnected by a connection 370.

For example, the connection 360 includes posts (post electrodes) 361 formed on the electrodes 331 of the processor 330 and made of, for example, Cu, and solders 362 (corresponding to bumps 360a to be described later) for bonding the posts 361 and the electrodes 311 of the region 310b of the printed circuit board 310 together. For example, the connection 370 includes solders for bonding the electrodes 332 of the processor 330 and the electrodes 325a of the region 320a of the interposer 320 together.

The memories 340 are located above the region 320b of the interposer 320. In the memory chips 341 in the lowermost layers of the memories 340, electrodes (pads) 342 are formed at positions corresponding to the electrodes 325 on the front surface of the region 320b of the interposer 320. The electrodes 342 of the memories 340 and the electrodes 325 of the region 320b of the interposer 320 are electrically interconnected by a connection 380. The connection 380 includes solders for bonding the electrodes 342 of the memories 340 and the electrodes 325 of the region 320b of the interposer 320 together. The electrodes 325a of the region 320a of the interposer 320 and the electrodes 325 of the region 320b of the interposer 320 are electrically interconnected by the conductors 323.

Although not illustrated here, an underfill (UF) resin may be filled between the printed circuit board 310 and the interposer 320 interconnected by the connection 350. Similarly, the UF resin may be filled between the printed circuit board 310 and the processor 330 interconnected by the connection 360. Similarly, the UF resin may be filled between the interposer 320 and the processor 330 interconnected by the connection 370 and between the interposer 320 and the memories 340 interconnected by the connection 380. When an UF resin is filled, strength of bonding may be increased between electronic parts with the UF resin interposed therebetween.

In the electronic device 300, the processor 330 is electrically connected with the memories 340 through the electrodes 332 at its end portion, the connection 370, the interposer 320 (its conductors 323 and electrodes 325), the connection 380 and the electrodes 342. By using the interposer 320, which is capable of wiring with higher density than the printed circuit board 310, for the electrical connection between the processor 330 and the memories 340, the bus width between the processor 330 and the memories 340 may be increased and the processor 330 and the memories 340 may be connected to each other by a short distance. Accordingly, high performance may be achieved by improved data processing capability of the electronic device 300 and low power consumption may be achieved by reduction in a transmission loss.

In the electronic device 300, the processor 330 is electrically connected with the printed circuit board 310 by the connection 360 directly without going through the interposer 320. Power is supplied from the power line 313 of the printed circuit board 310 to the processor 330 through the electrodes 311 connected to the power line 313, the connection 360 and the electrodes 331. The size of the connection 360 may be arbitrarily set independently of the interposer 320. For example, the posts 361 may be formed to have a diameter larger than those of the vias 324 of the interposer 320. By using the connection 360 with an appropriate size without going through the interposer 320, power, which is enough to cause the processor 330 to execute a desired operation, may be supplied from the printed circuit board 310.

With the above configuration, the electronic device 300 capable of sufficiently exhibiting the performance of the processor 330 or the performance of the processor 330 and memories 340 may be achieved.

In addition, in the electronic device 300, the area of the interposer 320 to be used may be reduced, as compared to the electronic device 200 of FIGS. 7A and 7B in which the processor 230 is mounted, along with the memories 240, on the interposer 220.

Figure 10:
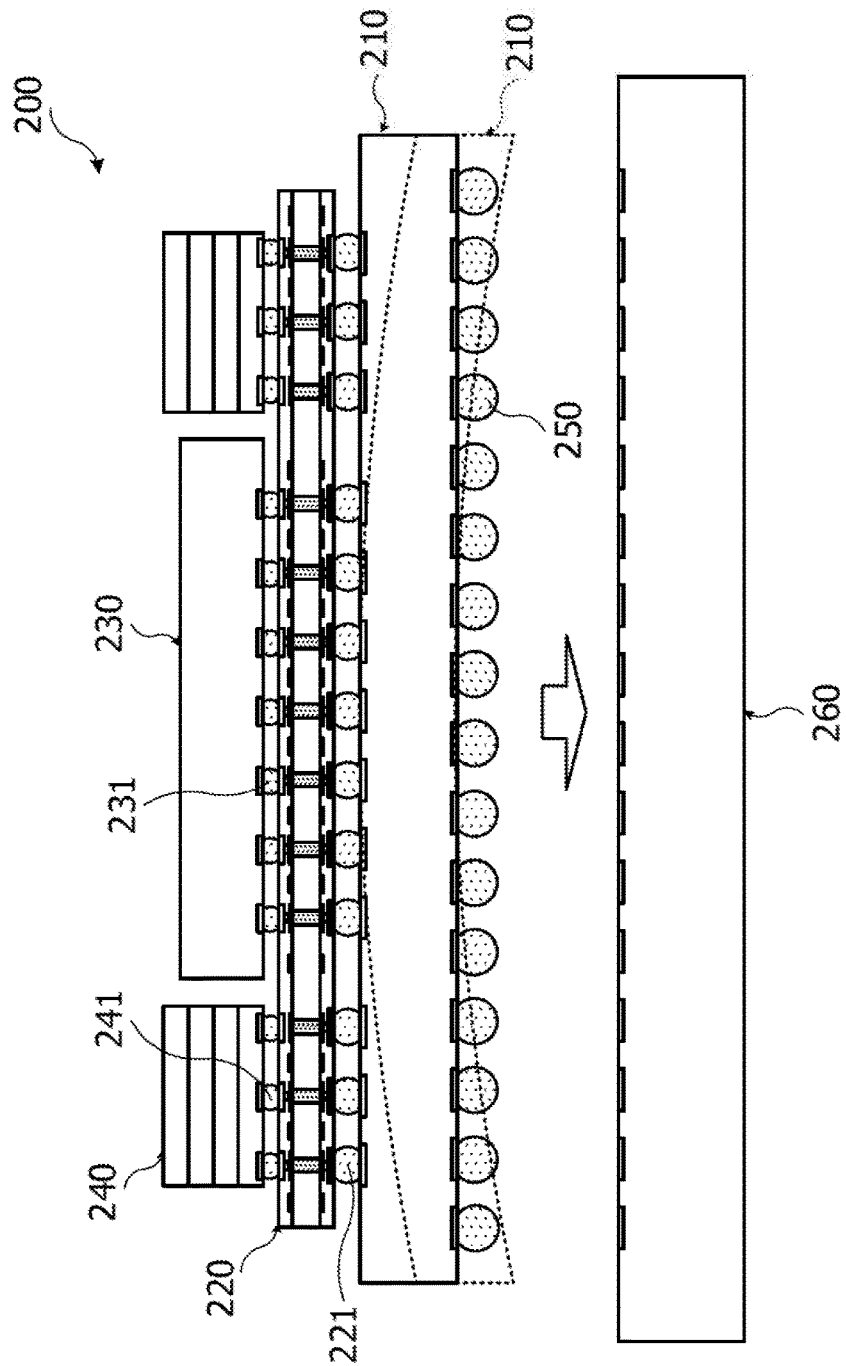
FIG. 10 is a view illustrating one example of an electronic device according to another embodiment.

Here, FIG. 10 is a view illustrating one example of an electronic device according to another embodiment. FIG. 10 is a schematic cross-sectional view of main parts of one example of the electronic device according to another embodiment.

The electronic device 200 illustrated in FIG. 10 corresponds to the electronic device 200 illustrated in FIGS. 7A and 7B. As illustrated in FIG. 10, in the electronic device 200 in which the processor 230 is mounted, along with the memories 240, on the interposer 220, one interposer 220 of such a planar size which may cover all of the processor 230 and memories 240 to be mounted is used. When such a relatively large-area interposer 220 is used, there is a possibility that a warpage occurs in the electronic device 200.

For example, when Si is used for the interposer 220 and an organic material is used for the printed circuit board 210, a difference in coefficient of thermal expansion (Si: about 3 [ppm/K] and the organic material: about 15 [ppm/K]) between them becomes large. In this case, when the relatively large-area interposer 220 is used, there occurs a warpage in which a central portion of the printed circuit board 210 becomes convex upward in the figure, as schematically indicated by a dotted contour of the printed circuit board 210 in FIG. 10. When such a warpage occurs, tip positions of the bumps 250 formed on the rear surface of the printed circuit board 310 are deviated. As a result, when the electronic device 200 is mounted on a system board (mother board) 260, some bumps 250 of the electronic device 200 may not be connected to the system board 260 with no contact with the system board 260.

In this way, when the interposer 220 has the relatively large area, the warpage occurs in the electronic device 200, which may result in a high risk of bonding defects. In addition, when the interposer 220 has the relatively large area, there is a high risk of lowering a production yield.

In contrast, in the electronic device 300, an arrangement is made to overlap a portion of the processor 330 with the interposer 320 and the processor 330 and the interposer 320 are electrically interconnected through the connection 370 or the like at the overlapping portion. In addition, the processor 330 and the printed circuit board 310 are electrically interconnected through the connection 360 or the like at a portion of the processor 330 which does not overlap with the interposer 320, thereby achieving sufficient supply of power to the processor 330, as described above.

Thus, in the electronic device 300, the interposer 320 may be reduced in size to such a planar size that the interposer 320 overlaps with a portion of the processor 330 rather than the entirety thereof. Accordingly, the occupation area of the interposer 320 on the printed circuit board 310 may be reduced, a warpage occurring in the electronic device 300 may be suppressed, and defects of bonding with the system board using the bumps 315 on the rear surface of the printed circuit board 310 may be suppressed. In addition, through the reduction of the planar size of the interposer 320, a production yield of the interposer 320 and the electronic device 300 including the same may be suppressed from being lowered.

A simulation on warpage for the electronic device 300 (FIGS. 8 and 9) according to the second embodiment and the electronic device 200 (FIGS. 7A and 7B, and 10) according to another embodiment has been made.

Figure 11A:
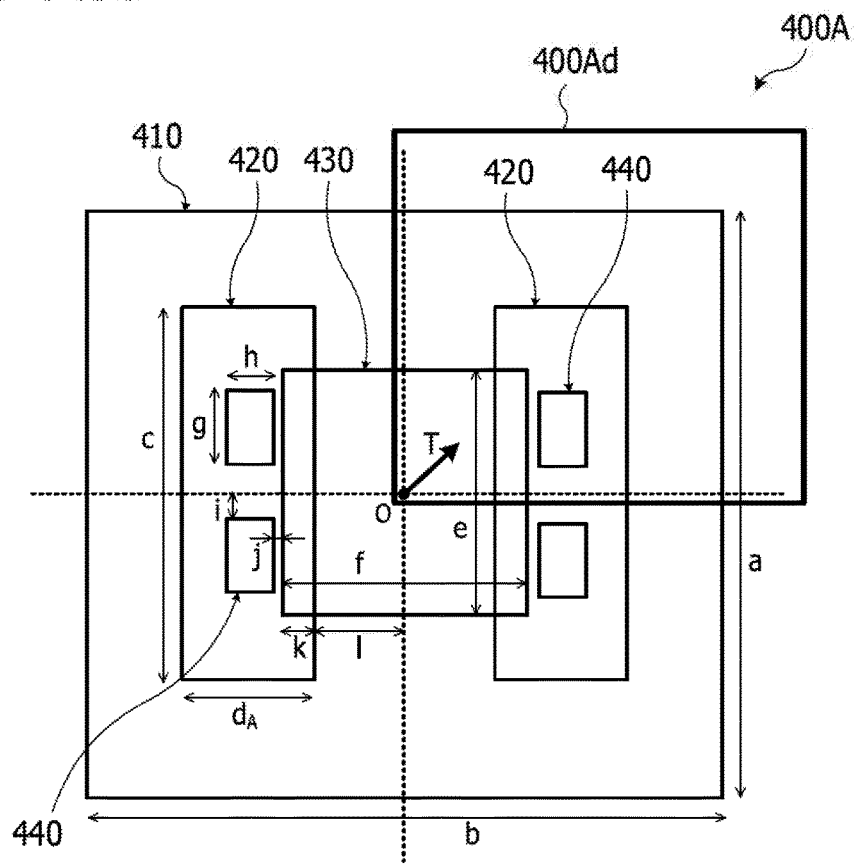
FIGS. 11A and 11B are views illustrating a simulation model on warpage of the electronic device according to the second embodiment.
Figure 11B:
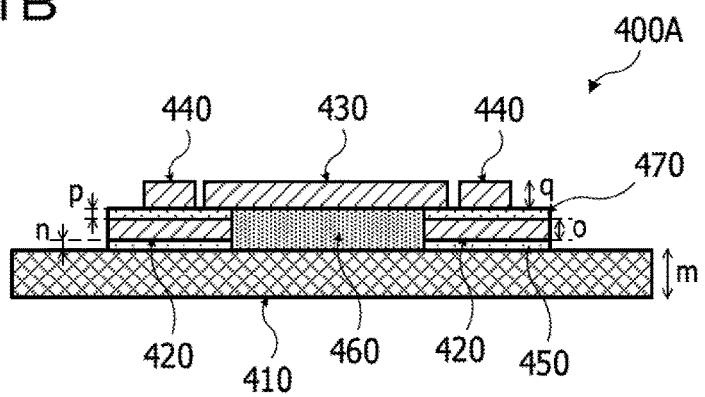
Figure 12A:
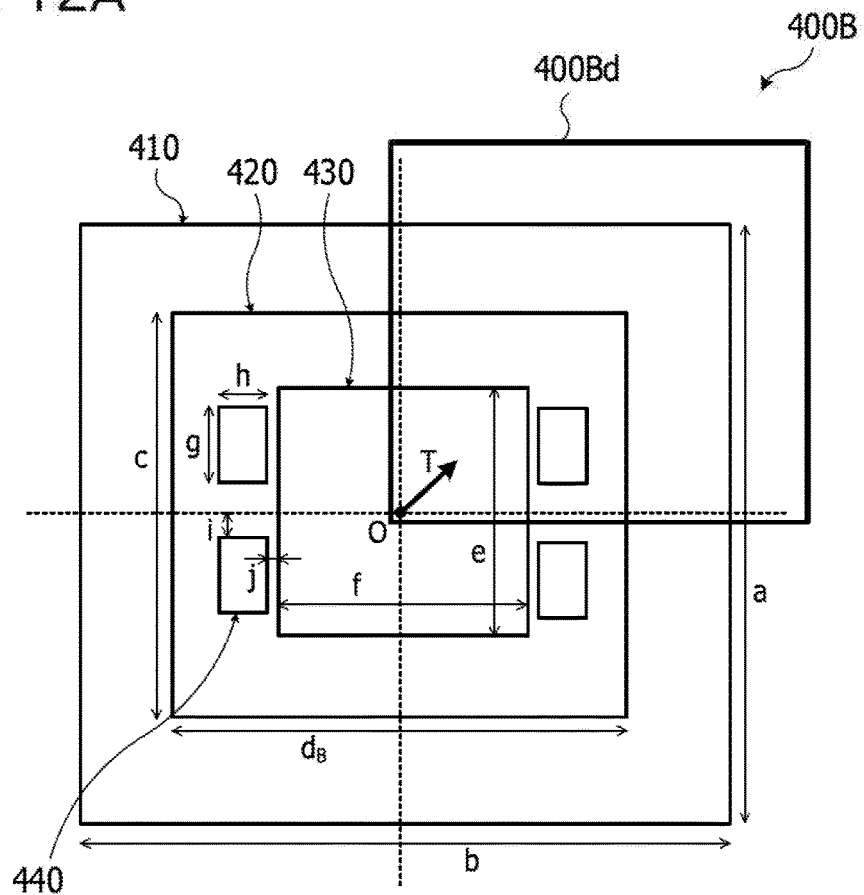
FIGS. 12A and 12B are views illustrating a simulation model on warpage of the electronic device according to another embodiment.
Figure 12B:
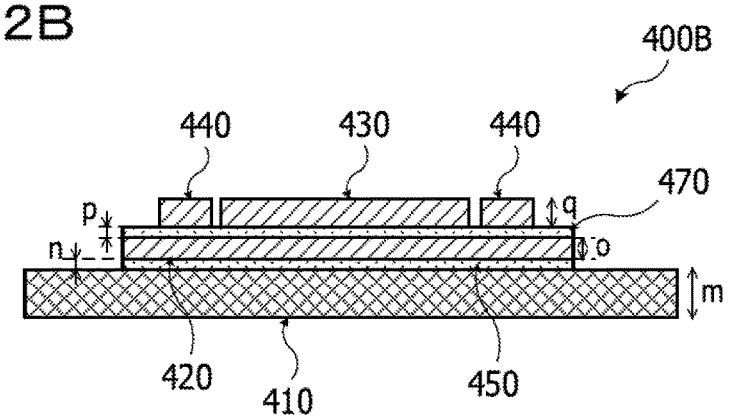

FIGS. 11A and 11B are views illustrating a simulation model on warpage of the electronic device according to the second embodiment and FIGS. 12A and 12B are views illustrating a simulation model on warpage of the electronic device according to another embodiment. FIGS. 11A and 12A are schematic plan views and 11B and 12B are schematic cross-sectional views.

For the electronic device 300 according to the second embodiment, a simulation on warpage is performed using a model 400A as illustrated in FIGS. 11A and 11B.

The model 400A includes an organic board 410 corresponding to a printed circuit board, a Si layer 420 corresponding to an interposer, a Si layer 430 corresponding to a processor, and a Si layer 440 corresponding to a memory. Such a planar layout is as illustrated in FIG. 11A. That is, two Si layers 420 are located to face with each other on the organic board 410, a Si layer 430 is located to overlap with a portion of each of the two Si layers 420, and four Si layers 440 in total (two for each of the two Si layers 420) are located on the two Si layers 420. In the model 400A, as illustrated in FIG. 11B, a solder/resin layer 450 corresponding to a solder and UF resin of a connection is interposed between the organic board 410 and the Si layers 420. A Cu/resin layer 460 corresponding to Cu and UF resin of a connection is interposed between the organic board 410 and the Si layer 430. A solder/resin layer 470 corresponding to a solder and UF resin of a connection is interposed between the Si layers 420 and the Si layer 430 and between the Si layers 420 and the Si layers 440.

For the electronic device 200 according to another embodiment, a simulation on warpage is performed using a model 400B as illustrated in FIGS. 12A and 12B.

The model 400B has a planar layout as illustrated in FIG. 12A. That is, one Si layer 420 corresponding to an interposer is located on an organic board 410 corresponding to a printed circuit board. In addition, one Si layer 430 corresponding to a processor and four Si layers 440 corresponding to memories are located on the Si layer 420. In the model 400B, as illustrated in FIG. 12B, rather than the Cu/resin layer 460 as in the model 400A, a solder/resin layer 450, the Si layer 420 and a solder/resin layer 470 are interposed between the organic board 410 and the Si layer 430.

The dimensions of respective parts of the model 400A and the model 400B are as follows. In FIGS. 11A and 12A, a=64 [mm], b=54 [mm], c=38 [mm], $d_A$=12 [mm], $d_B$=44 [mm], e=f=24 [mm], g=7 [mm], h=5 [mm], I=2 [mm], j=1 [mm], k=2 [mm], and l=10 [mm]. In FIGS. 11B and 12B, m=1 [mm], n=0.07 [mm], o=0.1 [mm], p=0.04 [mm], and q=0.5 [mm].

In addition, physical properties of respective parts of the model 400A and the model 400B are as follows. For the organic board 410, the Young's modulus E=27 [GPa], the coefficient of thermal expansion CTE=14 [ppm/K], and the Poisson's ratio=0.2. For the Si layers 420, 430, and 440, the Young's modulus E=120 [GPa], the coefficient of thermal expansion CTE=2.7 [ppm/K] and the Poisson's ratio=0.3. For the solder/resin layers 450 and 470, the Young's modulus E=12 [GPa], the coefficient of thermal expansion CTE=61 [ppm/K], and the Poisson's ratio=0.3. For the Cu/resin layer 460, the Young's modulus E=23 [GPa], the coefficient of thermal expansion CTE=60 [ppm/K], and the Poisson's ratio=0.3.

For a division region 400Ad and a division region 400Bd obtained by dividing each of the above-described model 400A and model 400B into four regions, a simulation on warpage was performed. Each of the division region 400Ad and the division region 400Bd is indicated by a thick-bordered box in FIGS. 11A and 12A. The centers O of the model 400A and the model 400B are assumed as the origins of the division region 400Ad and the division region 400Bd, respectively. A direction T represents a diagonal direction from the origin O of each of the division region 400Ad and the division region 400Bd.

Figure 13:
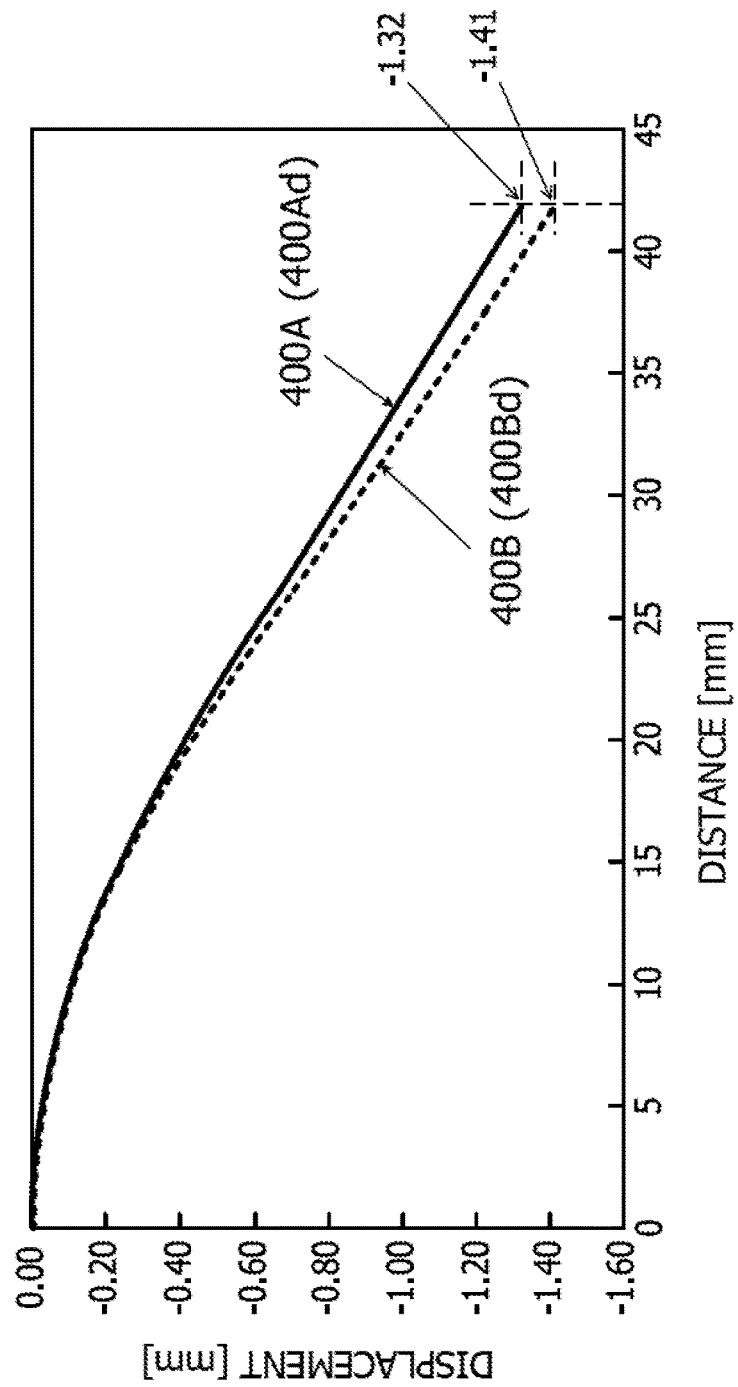
FIG. 13 is a view illustrating one example of a result of the simulation on warpage.

FIG. 13 illustrates one example of a result of the simulation on warpage. FIG. 13 illustrates a displacement of the diagonal direction T from the origin O of each of the division region 400Ad of the model 400A and the division region 400Bd of the model 400B. In FIG. 13, a horizontal axis represents a distance [mm] of the diagonal direction T from the origin O and a vertical axis represents a displacement [mm]. In FIG. 13, a relationship between the distance and the displacement, which was obtained for the division region 400Ad of the model 400A, is indicated by a solid line and a relationship between distance and displacement, which was obtained for the division region 400Bd of the model 400B, is indicated by a dotted line.

It is observed from FIG. 13 that the division region 400Ad of the model 400A (the relationship indicated by the solid line in FIG. 13) exhibits an effect of reduction in a warpage by about 90 [μm] in a corner as compared to the division region 400Bd of the model 400B (the relationship indicated by the dotted line in FIG. 13). The diameter of the bumps 315 used to mount the electronic device 300 corresponding to the model 400A on the system board is about 750 [μm]. For the bumps 315 having the diameter of 750 [μm], a deviation of 90 [μm] due to the warpage is a significant value that may cause a difference in determining whether or not the bumps 315 are in contact with the system board. According to the electronic device 300, the warpage may be suppressed and defectiveness may be suppressed during bonding of the bumps 315 with the system board. As a result, a production yield of devices for mounting the electronic device 300 on the system board may be increased and production costs may be reduced.

Next, a method for forming the above-described electronic device 300 will be described by way of an example.

First, an interposer 320 will be described.

Figure 14:
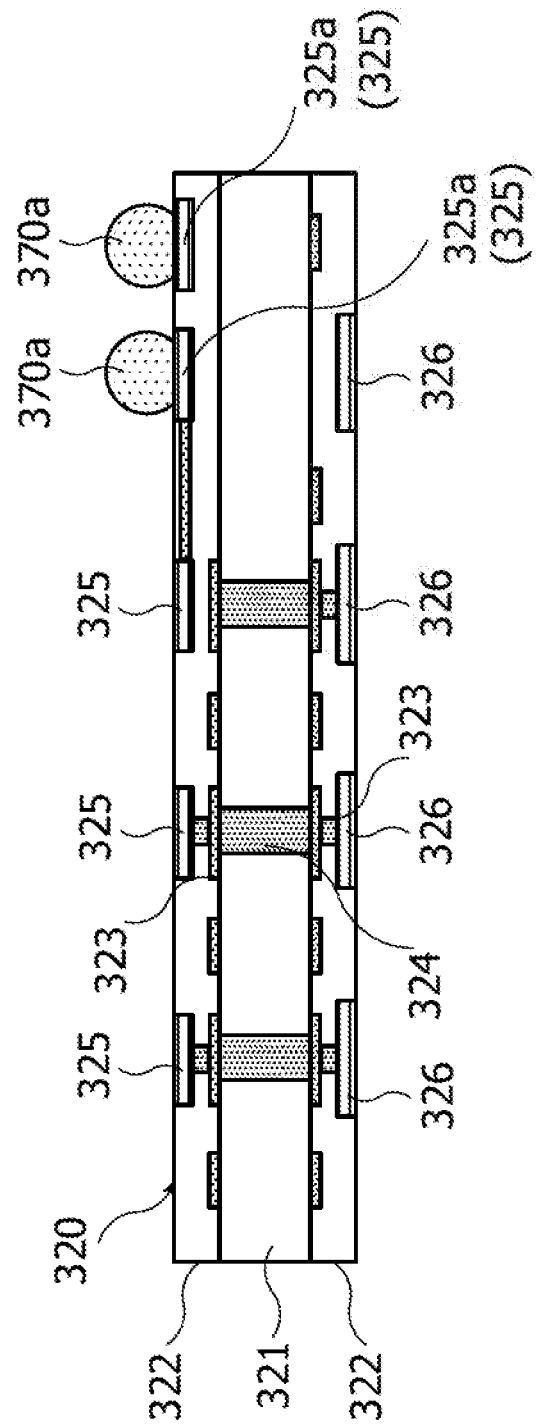
FIG. 14 is a view illustrating one example of an interposer according to the second embodiment.

FIG. 14 is a view illustrating one example of an interposer according to the second embodiment. FIG. 14 schematically illustrates a cross-section of main parts of one example of the interposer according to the second embodiment.

For example, as illustrated in FIG. 14, an interposer 320 formed with bumps 370a is prepared. The interposer 320 includes a base member 321 made of, for example, Si, vias 324 penetrating through the base member 321, and wiring layers 322 respectively formed on the front and rear surfaces of the base member 321. Conductors 323 respectively formed in the wiring layers 322 on the front and rear surfaces are electrically connected to each other by the vias 324. Electrodes 325 and electrodes 326 are formed on the front and rear surfaces of the interposer 320, respectively.

Electrodes 325a which are formed in the end portion (region 320a) of the interposer 320 and are used for electrical connection with the processor 330 located to overlap with the interposer 320 are included in the electrodes 325 on the front surface of the interposer 320. The electrodes 325a formed in this end portion are electrically connected with other electrodes 325 formed in the inner side through the conductors 323. The bumps 370a are formed on the electrodes 325a of this end portion.

The interposer 320 formed with the bumps 370a as illustrated in FIG. 14 is formed using a method as illustrated in FIG. 15A to 15D or 16A to 16C to be described below.

FIGS. 15A to 15D are views illustrating one example of a method for forming an interposer according to the second embodiment. FIGS. 15A to 15D schematically illustrate a cross-section of main parts in each step of one example of a method for forming an interposer.

Figure 15A:
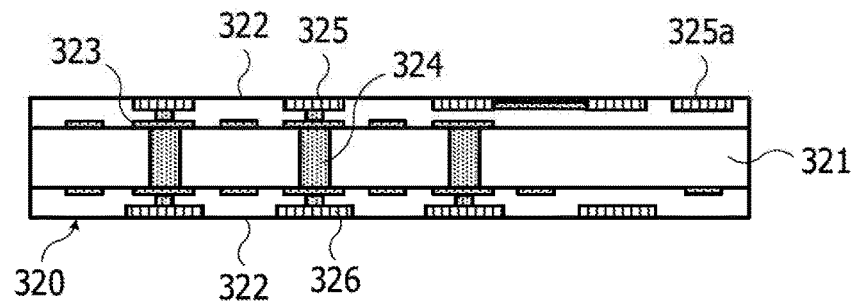
FIGS. 15A to 15D are views illustrating one example of a method for forming the interposer according to the second embodiment.

First, as illustrated in FIG. 15A, an interposer 320 is prepared. In that case, for example, vias 324 are first formed in a base member 321 and wiring layers 322 are then formed on the front and rear surfaces of the base member 321.

When Si is used for the base member 321, a through silicon via (TSV) process including, for example, a deep etching process or a conductor filling process is used to form the vias 324. For example, when Si of a thickness of 100 [μm] is used for the base member 321, this process is used to form the vias 324. As another example, when glass or organic material is used for the base member 321, a punching process using drill machining or laser irradiation or a conductor filling process is used to form the vias 324.

In addition, an insulating film and conductive film forming process, a photolithographic process, or an etching process is used to form the wiring layers 322. The vias 324 and the conductors 323 of the wiring layers 322 in the interposer 320 may be made of various conductive materials. For example, Cu is used to form the conductors of the interposer 320. The electrodes 325 including the electrodes 325a of the end portion of the interposer 320 are formed on the wiring layer 322 on the front surface of the interposer 320 and the electrodes 326 are formed on the wiring layer 322 of the rear surface thereof. The electrodes 325 and the electrodes 326 are considered as, e.g., pads of Cu. Alternatively, Cu pads with a surface treatment layer of nickel (Ni)/palladium (Pd)/gold (Au) or surface treatment layer of Ni/Au formed thereon may be used for the electrodes 325 and the electrodes 326.

The bumps 370a are formed on the electrodes 325a of the end portion of the wiring layer 322 on the front surface. For example, when the pitches of the bumps 370a are smaller than 100 [μm], a photolithographic process may be used to form the bumps 370a, as illustrated in FIGS. 15A to 15D.

Figure 15B:
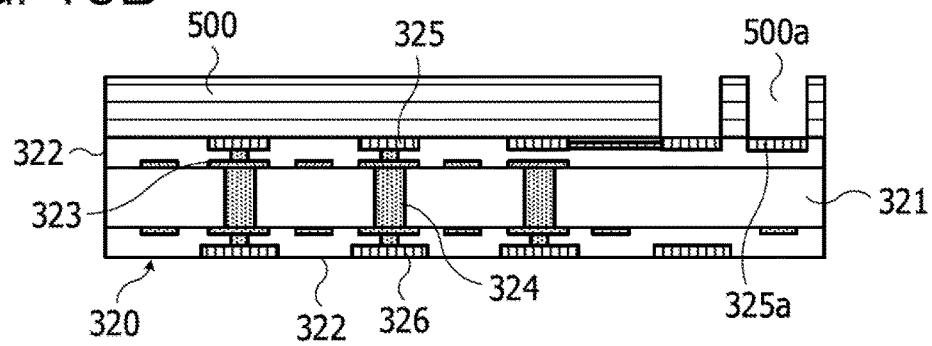
Figure 15C:
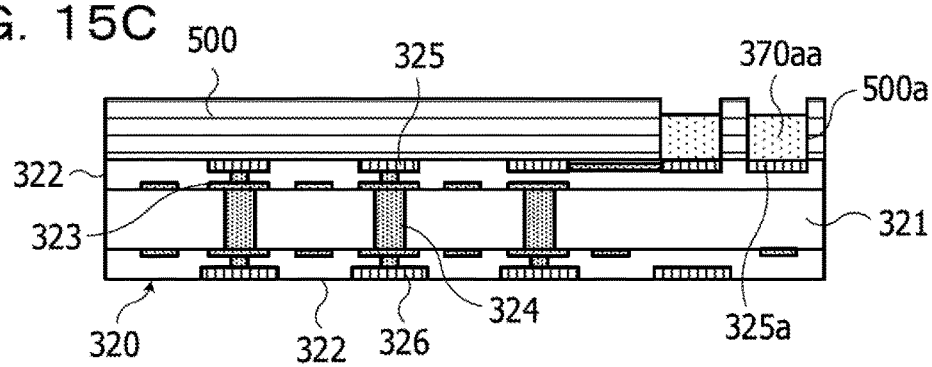
Figure 15D:
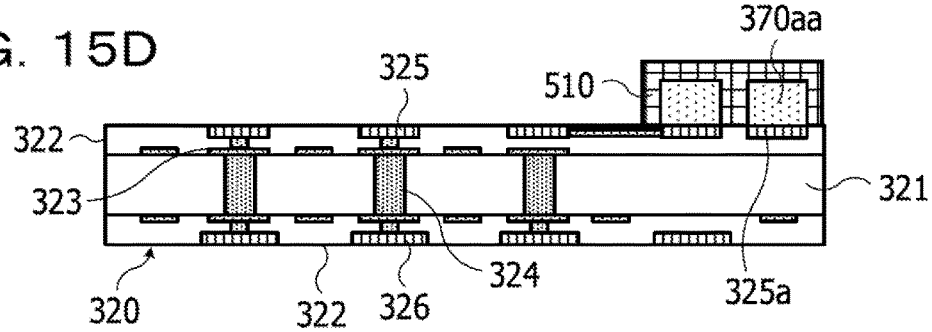

In that case, first, as illustrated in FIG. 15B, a resist 500 having openings 500a communicating to the electrodes 325a of the end portion is formed on the wiring layer 322 on the front surface. Next, as illustrated in FIG. 15C, an electrolytic plating process is used to form a solder plating layer 370aa on the electrodes 325a in the openings 500a. For example, an electrolytic plating process is used to deposit a binary alloy solder of tin (Sn)-silver (Ag) to form the solder plating layer 370aa. Next, as illustrated in FIG. 15D, the resist 500 is removed, a flux 510 is coated on a region where the solder plating layer 370aa is formed, and a reflow process of a predetermined temperature, e.g., a peak temperature of 250 [° C.], is performed. The solder plating layer 370aa is melt by the reflow process and the bumps 370a having a rounded shape due to a surface tension are formed, as illustrated in FIG. 14.

Figure 16A:
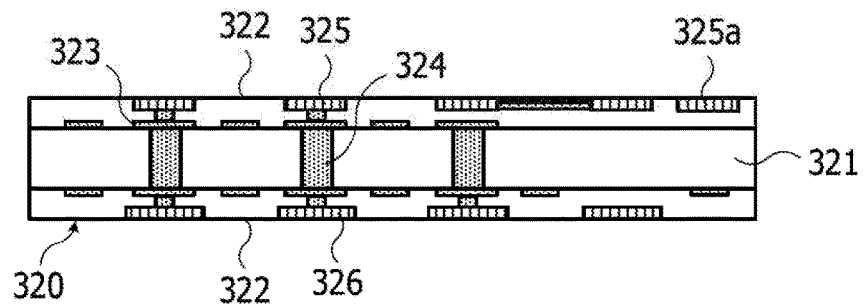
FIGS. 16A to 16C are views illustrating another example of a method for forming the interposer according to the second embodiment.
Figure 16B:
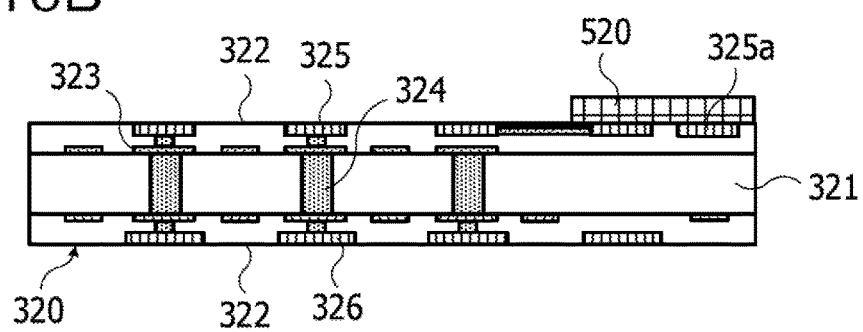
Figure 16C:
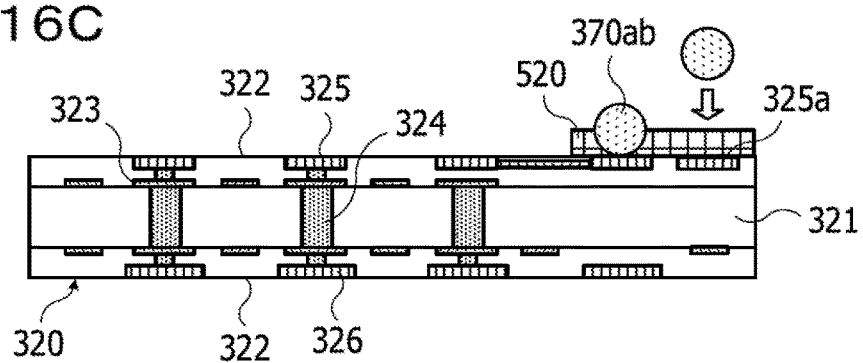

On the other hand, when the pitches of the bumps 370a formed on the electrodes 325a are larger than 100 [μm], a method as illustrated in FIGS. 16A to 16C to be described below may be used to form the bumps 370a.

FIGS. 16A to 16C are views illustrating another example of a method for forming an interposer according to the second embodiment. FIGS. 16A to 16C schematically illustrate a cross-section of main parts in each step of another example of a method for forming an interposer.

First, as illustrated in FIG. 16A, an interposer 320 is prepared. In the same manner as illustrated in FIG. 15A, the interposer 320 is prepared by first forming vias 324 in a base member 321 and then forming wiring layers 322 on the front and rear surfaces of the interposer 320.

After the interposer 320 as illustrated in FIG. 16A is prepared, a flux 520 is coated on a region where electrodes 325a of the end portion of the interposer 320 are to be formed, as illustrated in FIG. 16B. Next, as illustrated in FIG. 16C, a metal mask having openings at positions corresponding to the electrodes 325a is used to mount solder balls 370ab on the electrodes 325a. For example, the solder balls 370ab using a binary alloy solder of Sn—Ag are mounted. After the solder balls 370ab are mounted, when a reflow process of a predetermined temperature (e.g., a peak temperature of 250 [° C.]) is performed, the solder balls 370ab are melt and the bumps 370a having a rounded shape due to a surface tension are formed, as illustrated in FIG. 14.

According to this method, the interposer 320 formed with the bumps 370a is formed.

Subsequently, a processor 330 will be described.

Figure 17:
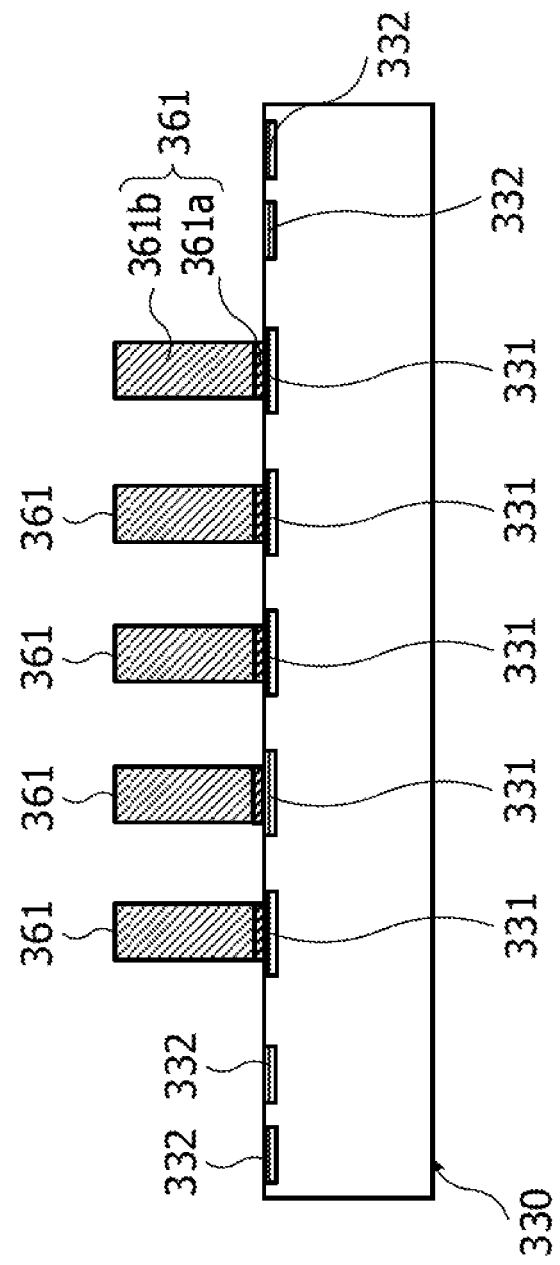
FIG. 17 is a view illustrating one example of a processor according to the second embodiment.

FIG. 17 is a view illustrating one example of a processor according to the second embodiment. FIG. 17 schematically illustrates a cross-section of main parts of one example of a processor according to the second embodiment.

For example, a processor 330 is prepared as illustrated in FIG. 17. The processor 330 includes a plurality of electrodes (pads) 331 and electrodes (pads) 332 which are formed on the front surface of the processor 330 and electrically connected to circuit elements such as internal transistors (not illustrated) and the like through conductors such as wirings and the like. The electrodes 331 are formed in a region which lies inwards from the end portion of the processor 330 and overlaps with the region 310b (see FIG. 9) of the printed circuit board 310. The electrodes 332 are formed in a region which lies in the end portion of the processor 330 and overlaps with the region 320a (see FIG. 9) of the interposer 320. Of these electrodes 331 and electrodes 332, posts 361 (including a seed layer 361a and a Cu plating layer 361b to be described later) are formed on the electrodes 331 that lie inwards from the end portion of the processor 330.

The processor 330 formed with the posts 361 as illustrated in FIG. 17 is formed using a method as illustrated in FIGS. 18A to 18D to be described below.

FIGS. 18A to 18D are views illustrating one example of a method for forming a processor according to the second embodiment. FIGS. 18A to 18D schematically illustrate a cross-section of main parts in each step of one example of a method for forming a processor.

Figure 18A:
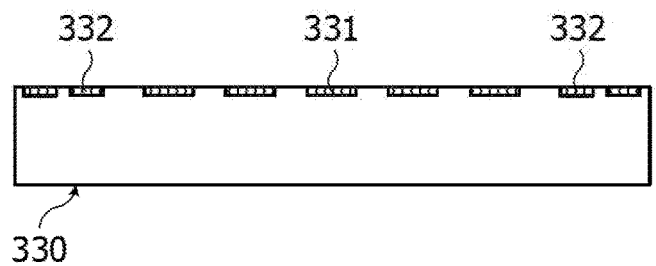
FIGS. 18A to 18D are views illustrating one example of a method for forming the processor according to the second embodiment.

First, as illustrated in FIG. 18A, a processor 330 having electrodes 331 and electrodes 332 is prepared. The electrodes 331 and the electrodes 332 are considered as, e.g., pads of Cu. Alternatively, Cu pads with a surface treatment layer of Ni/Pd/Au or a surface treatment layer of Ni/Au formed thereon may be used for the electrodes 331 and the electrodes 332.

Figure 18B:
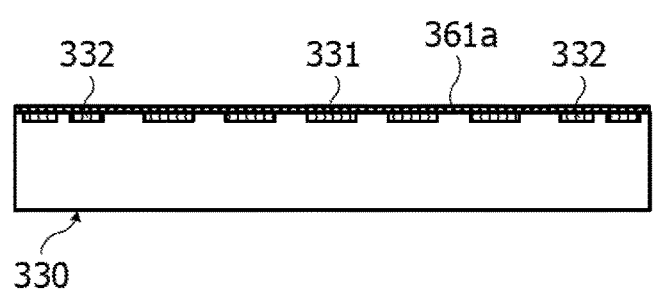
Figure 18C:
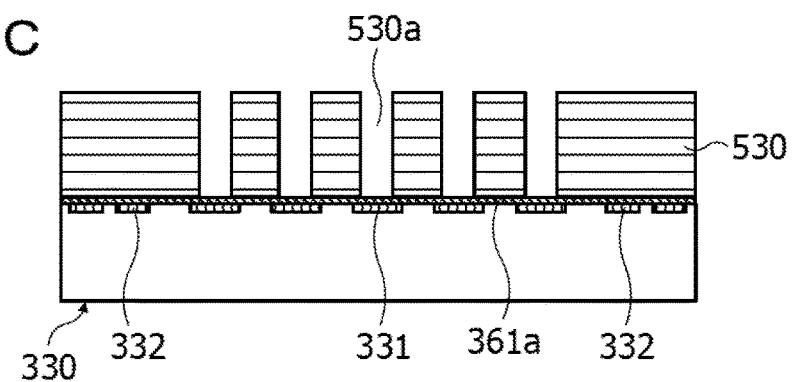

Next, a seed layer 361a is formed as illustrated in FIG. 18B and a resist 530 which has openings 530a at positions corresponding to the electrodes 331 and covers a region corresponding to the electrodes 332 is formed as illustrated in FIG. 18C.

Figure 18D:
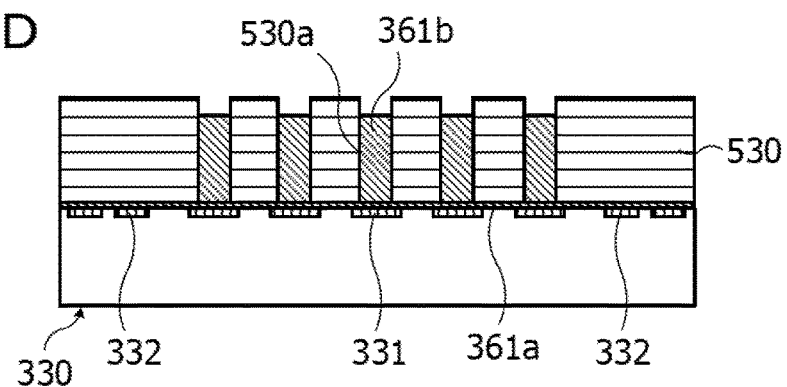

Next, as illustrated in FIG. 18D, an electrolytic plating process is used to form, for example, a Cu plating layer 361b on the seed layer 361a in the openings 530a. Thereafter, the processor 330 having the posts 361 (the seed layer 361a and the Cu plating layer 361b) formed on the electrodes 331 is formed by removing the resist 530 and removing the seed layer 361a exposed after removing the resist 530.

When mounting the processor 330 on the printed circuit board 310 (see, e.g., FIGS. 8 and 9), the posts 361 are required to have a relatively large height exceeding the thickness of the interposer 320. Therefore, it is desirable that a dry film resist capable of being exposed and developed at a thickness of, e.g., 100 [μm] or more is used for the resist 530 to be formed in the step of FIG. 18C.

From the standpoint of process versatility and high allowable current, it is desirable that the posts 361 are made of the same Cu as the Cu plating layer 361b. However, the posts 361 are not limited to Cu, but may be made of other conductive materials such as Ni or the like or may have a laminated structure of different kinds of conductive materials such as Cu/Ni or the like. Such various kinds of conductive materials may be formed by the electrolytic plating process in the same manner as the Cu plating layer 361b. The height of the posts 361 may be adjusted to any height by controlling a current density and plating time when a plating layer such as, for example, the Cu plating layer 361b is formed in the openings 530a of the resist 530, as illustrated in FIG. 18D.

Subsequently, an assembly method will be described.

FIGS. 19A to 19C and 20A to 20C are views illustrating one example of an assembly method according to the second embodiment. FIGS. 19A to 19C and 20A to 20C schematically illustrate a cross-section of main parts of each step of one example of an assembly method according to the second embodiment.

Figure 19A:
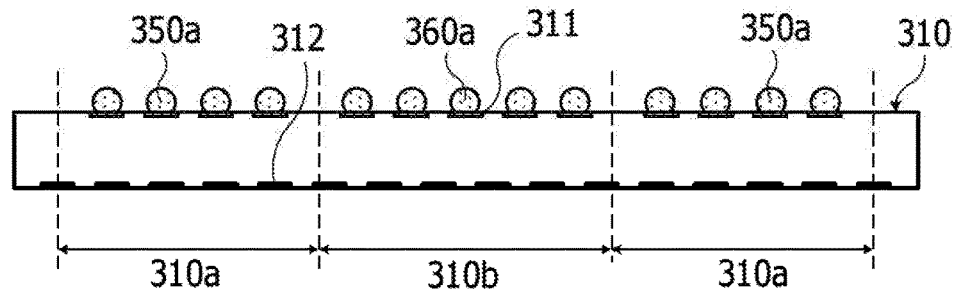
FIGS. 19A to 19C are views illustrating one example of an assembly method according to the second embodiment (Part 1)

First, as illustrated in FIG. 19A, bumps 350a and bumps 360a are formed on electrodes 311 of the front surfaces of regions 310a and a region 310b of a printed circuit board 310. The bumps 350a and the bumps 360a may be made of the same material or different materials. In addition, the bumps 350a and the bumps 360a may have the same size (diameter) or different sizes (diameters).

When forming the bumps 350a and the bumps 360a, for example, first, a metal mask having openings at positions corresponding to the electrodes 311 of the printed circuit board 310 is used to mount solder balls using a binary alloy solder of, for example, Sn—Ag on the electrodes 311. Then, a reflow process of a predetermined temperature, e.g., a peak temperature of 250 [° C.], is performed. Thus, the bumps 350a and the bumps 360a are formed as illustrated in FIG. 19A.

Figure 19B:
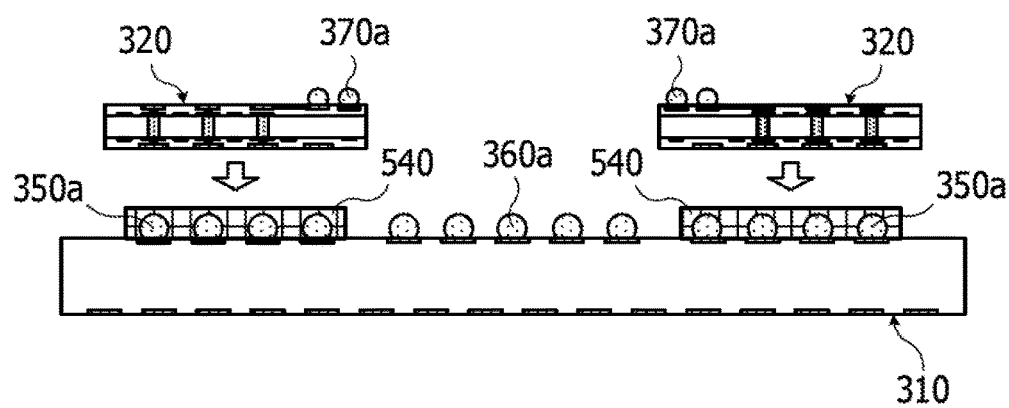

Next, as illustrated in FIG. 19B, a flux 540 is coated on the regions 310a of the printed circuit board 310 where the bumps 350a are formed. Then, the interposer 320, which is formed using the method as illustrated in FIG. 15A to 15D or 16A to 16C and is formed with the bumps 370a as illustrated in FIG. 14 is positioned and temporarily mounted using a flip chip bonder.

Figure 19C:
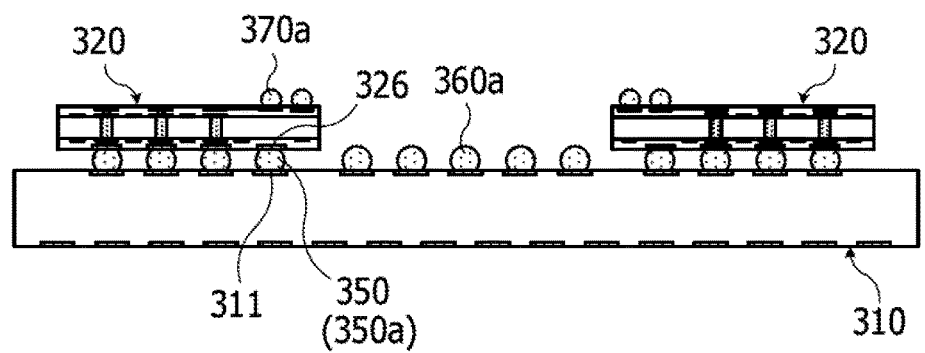

Thereafter, for example, by performing a reflow process of a peak temperature of 250 [° C.], the electrodes 326 of the interposer 320 and the electrodes 311 of the regions 310a of the printed circuit board 310 are bonded together by the bumps 350a, as illustrated in FIG. 19C. Thus, a structure where the interposer 320 and the printed circuit board 310 are electrically interconnected by the connection 350 is obtained.

Figure 20A:
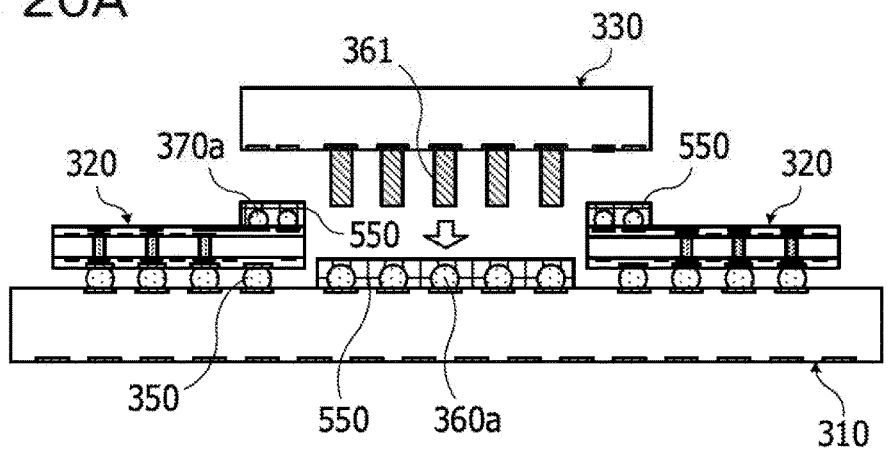
FIGS. 20A to 20C are views illustrating another example of the assembly method according to the second embodiment (Part 2)

Next, as illustrated in FIG. 20A, a flux 550 is coated on the bumps 360a formed on the printed circuit board 310 and the bumps 370a formed on the interposer 320. Then, the processor 330, which is formed using the same method as in FIGS. 18A to 18D and is formed with the same posts 361 as in FIG. 17, is positioned and temporarily mounted using the flip chip bonder.

Figure 20B:
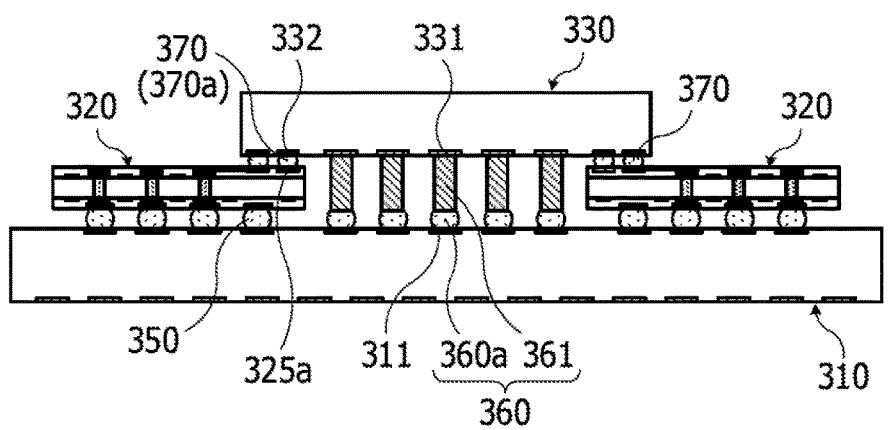

Thereafter, for example, a reflow process of a peak temperature of 250 [° C.] is performed so as to bond the posts 361 of the processor 330 and the electrodes 311 of the printed circuit board 310 by the bumps 360a, as illustrated in FIG. 20B. At the same time, the electrodes 332 on the end portions of the processor 330 where the posts 361 are not formed and the electrodes 325a on the end portions of the interposers 320 are bonded together by the bumps 370a. Thus, a structure is obtained in which the processor 330 and the printed circuit board 310 are electrically interconnected by the connections 360 including the posts 361 and the bumps 360a (corresponding to the above-mentioned solders 362) and the processor 330 and the interposers 320 are electrically interconnected by the connections 370.

When bonding the processor 330 to the printed circuit boards 310 and the interposers 320, the above-described reflow boding process may be used to achieve the self-alignment of the solder used for the bumps 360a and the bumps 370a. Therefore, even when the bumps 360a and the bumps 370a having different sizes are mixed, the processor 330 and the printed circuit board 310 may be bonded together and the processor 330 and the interposers 320 may be bonded together through the solder self-alignment while suppressing mutual misalignment. In addition, when the height of the posts 361 of the processor 330 is adjusted, the bonding of the processor 330 and the printed circuit board 310 and the bonding of the processor 330 and the interposer 320 may be performed simultaneously.

Although the method of using the flux 540 and the flux 550 to perform the reflow process (see, e.g., FIGS. 19B, 19C, 20A and 20B) has been illustrated above, a so-called fluxless reflow process using no flux may be performed. For example, in the steps of FIGS. 19B and 19C, after temporarily mounting the interposers 320 without using the flux 540, a reflow process is performed in a formic acid gas atmosphere to bond the interposer 320 to the printed circuit board 310. In addition, in the steps of FIGS. 20A and 20B, after temporarily mounting the processor 330 without using the flux 550, a reflow process is performed in a formic acid gas atmosphere to bond the processor 330 to the printed circuit board 310 and the interposers 320. In the fluxless reflow process, since interference between a flux and a solder is eliminated, the effect of self-alignment may be enhanced.

Figure 20C:
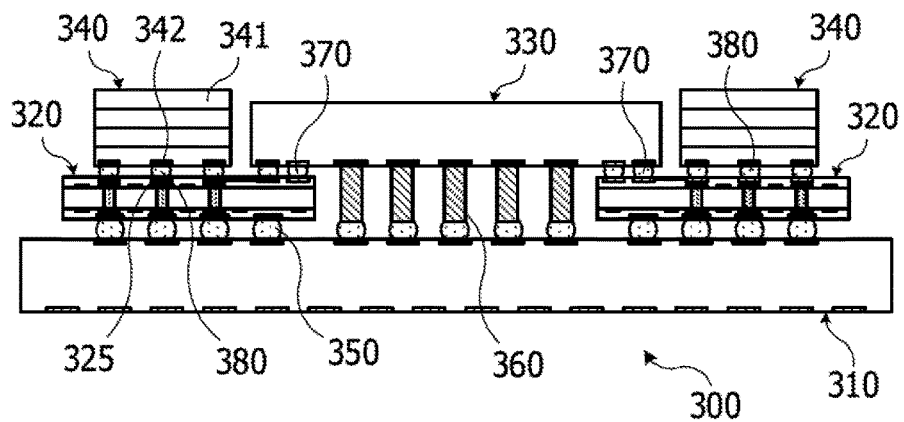

After the processor 330 is bonded to the printed circuit board 310 and the interposers 320 as in FIG. 20B, memories 340 are mounted on the interposers 320, as illustrated in FIG. 20C. For example, a flip chip bonder is used to temporarily mount the memories 340 with bumps using a binary alloy solder of Sn—Ag or the like formed on the electrodes 342 and a reflow process with or without a flux is performed to bond the bumps of the memories 340 to the electrodes 325 of the interposer 320. Alternatively, after the lowermost memory chips 341 formed with the bumps are bonded to the electrodes 325 of the interposer 320 in the same manner, the second and subsequent layers of memory chips 341 are sequentially stacked on the lowermost memory chips 341. Thus, a structure is obtained in which the memories 340 and the interposers 320 are electrically interconnected by the connections 380.

Through the above-described steps, the electronic device 300 as illustrated in FIG. 20C is formed.

In addition, an UF resin may be interposed between the printed circuit board 310 and the interposers 320 and the processor 330 and between the interposers 320 and the processor 330 and the memories 340.

In addition to the above-described method of using the reflow process to mount the memories 340 on the interposers 320, the following method may be used. Specifically, by applying an UF resin on the interposers 320 in advance and heating the memories 340 by means of a flip chip bonder, the solder bonding of the memories 340 and the sealing of the bonding portion by the UF resin are performed at once. This method may be used to interpose an UF resin between the memories 340 and the interposer 320.

For example, after the electronic device 300 is formed as illustrated in FIG. 20C, a test for evaluating the functionality and reliability of the electronic device 300 is carried out. Through this test, the electronic device 300 is sorted into a good product and an inferior product. For an inferior electronic device 300, for example, when the connections 360 and the connections 370 are heated to a temperature that is equal to or higher than the melting point of the solder used for these connections 360 and 370, the processor 330 may be removed and repaired using a new separate processor 330. In addition, when the connections 380 are heated to a temperature that is equal to or higher than the melting point of the solder used for the connection 380, the memories 340 may be removed and repaired using new separate memories 340. In addition, when the connections 350 are heated to a temperature that is equal to or higher than the melting point of the solder used for the connection 350 after the processor 330 is removed, the interposers 320 may be removed and repaired using new separate interposers 320. When the memories 340 mounted on the interposers 320 in the fine connections 380 are removed alone, it may be difficult to carry out cleaning and repairing operations thereafter. However, in such a case, the memories 340 may be removed and repaired together with the interposers 320.

Figure 21:
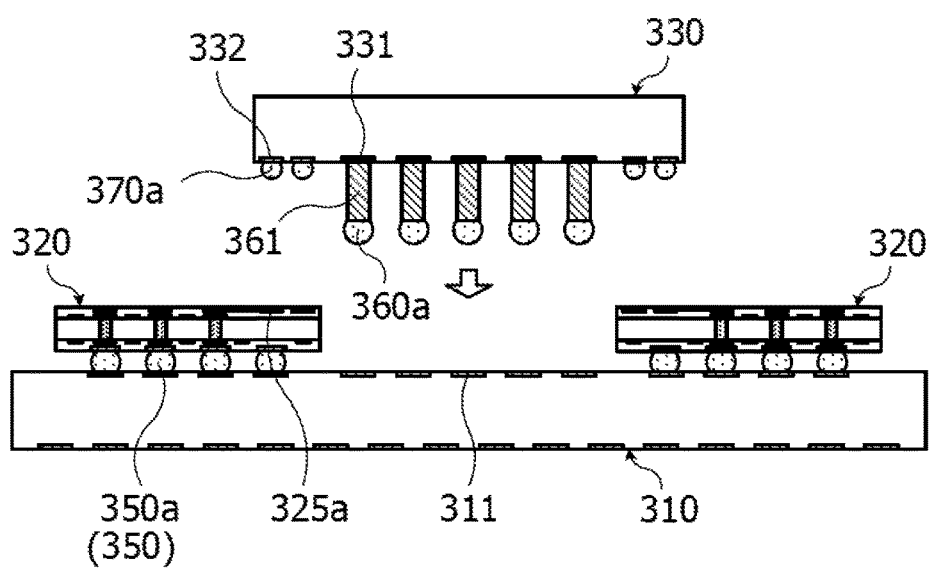
FIG. 21 is a view illustrating a first modification of the assembly method according to the second embodiment.
Figure 22:
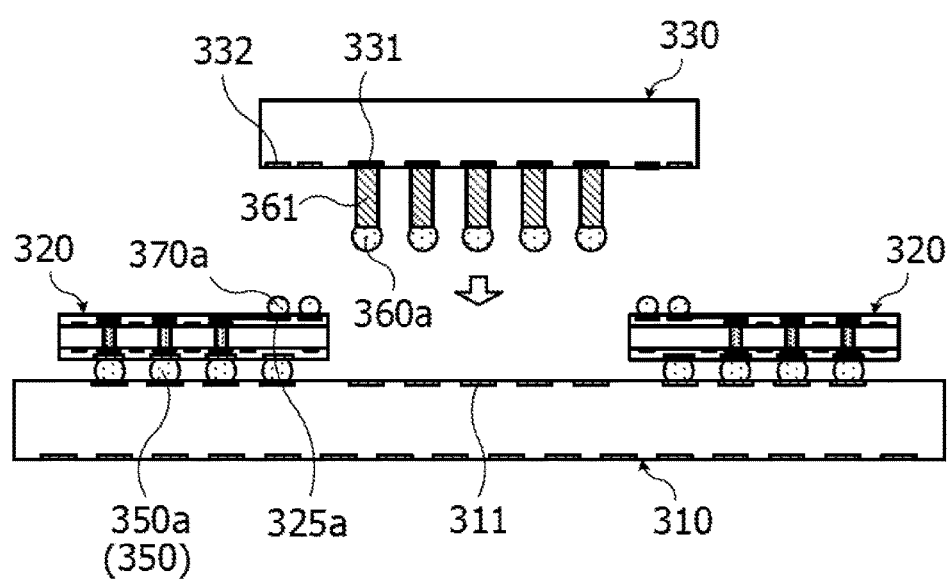
FIG. 22 is a view illustrating a second modification of the assembly method according to the second embodiment.
Figure 23:
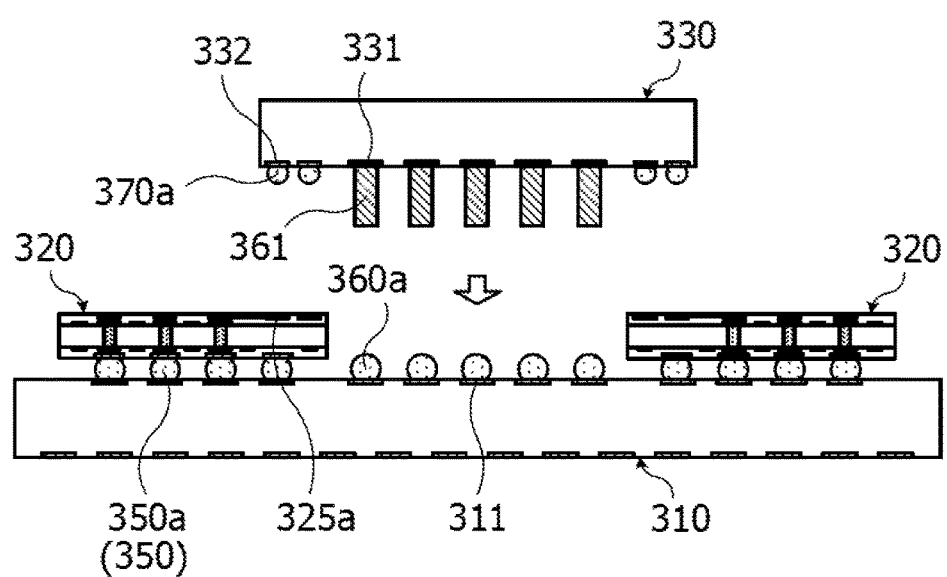
FIG. 23 is a view illustrating a third modification of the assembly method according to the second embodiment.

As one example of the above-described method, other methods as illustrated in FIGS. 21 to 23 to be described below may be used to form an electronic device 300.

FIG. 21 is a view illustrating a first modification of the assembly method according to the second embodiment. FIG. 21 schematically illustrates a cross-section of main parts of the first modification of the assembly method according to the second embodiment.

The method illustrated in FIG. 21 is to form bumps 360a on the posts 361 of the processor 330, form bumps 370a on the electrodes 332 of the processor 330, and bond these bumps 360a and 370a to the printed circuit board 310 and the interposers 320 bonded to bumps 350a (the connection 350) on the printed circuit board 310.

In the method illustrated in FIG. 21, the interposers 320 to be used may be similar to those illustrated in FIG. 15A or 16A. In addition, the processor 330 is obtained by forming the bumps 360a on the posts 361, which are formed on the electrodes 331 as illustrated in FIGS. 18A to 18D using a solder, and forming the bumps 370a on the electrodes 332 using a solder. The bumps 360a on the posts 361 may be obtained, for example, by forming a Cu plating layer 361b through an electrolytic plating process, which is followed by forming a solder through an electrolytic plating process.

The processor 330 with the bumps 360a formed on the posts 361 and the bumps 370a formed on the electrodes 332 is temporarily mounted on the interposers 320 and the printed circuit board 310 to which the interposers 320 are bonded, and then a reflow process is performed. Thus, a structure as illustrated in FIG. 20B is obtained where the processor 330 is electrically connected with the printed circuit board 310 through the connections 360 and is electrically connected with the interposers 320 through the connections 370. Thereafter, in the same manner as described above, the electronic device 300 is obtained by mounting the memories 340 on the interposers 320 as in FIG. 20C.

FIG. 22 is a view illustrating a second modification of the assembly method according to the second embodiment. FIG. 22 schematically illustrates a cross-section of main parts of the second modification of the assembly method according to the second embodiment.

The method illustrated in FIG. 22 is to form bumps 360a on the posts 361 of the processor 330 and bond the bumps 360a to the printed circuit board 310 and the interposers 320 bonded to bumps 350a (the connections 350) on the printed circuit board 310. The bumps 370a serving as the connections 370 between the processor 330 and the interposers 320 are formed on the interposers 320.

In the method illustrated in FIG. 22, the interposers 320 to be used may be similar to those illustrated in FIG. 14. In addition, the processor 330 is obtained by forming the bumps 360a on the posts 361, which are formed on the electrodes 331 as illustrated in FIGS. 18A to 18D, using a solder. The bumps 360a on the posts 361 may be obtained, for example, by forming a Cu plating layer 361b through an electrolytic plating process, which is followed by forming a solder through an electrolytic plating process.

The processor 330 with the bumps 360a formed on the posts 361 is temporarily mounted on the interposers 320 and the printed circuit board 310 to which the interposers 320 is bonded, and then a reflow process is performed. Thus, a structure as illustrated in FIG. 20B is obtained in which the processor 330 is electrically connected with the printed circuit board 310 through the connections 360 and is electrically connected with the interposers 320 through the connections 370. Thereafter, in the same manner as described above, the electronic device 300 is obtained by mounting the memories 340 on the interposers 320 as in FIG. 20C.

FIG. 23 is a view illustrating a third modification of the assembly method according to the second embodiment. FIG. 23 schematically illustrates a cross-section of main parts of a third modification of the assembly method according to the second embodiment.

The method illustrated in FIG. 23 is to form bumps 370a on the electrodes 332 of the processor 330 and bond the processor 330 to the printed circuit board 310 and the interposers 320 bonded to the printed circuit board 310 on the bumps 350a (the connections 350).

In the method illustrated in FIG. 23, the interposers 320 to be used may be similar to those illustrated in FIG. 15A or 16A. In addition, the processor 330 is obtained by forming the posts 361 on the electrodes 331, as illustrated in FIGS. 18A to 18D, and forming the bumps 370a on the electrodes 332 using a solder. The bumps 370a on the electrodes 332 may be obtained, for example, by forming a solder through an electrolytic plating process or mounting solder balls.

The processor 330 with the bumps 370a formed on the electrodes 332 is temporarily mounted on the interposers 320 and the printed circuit board 310 to which the interposers 320 are bonded, and then a reflow process is performed. Thus, a structure as illustrated in FIG. 20B is obtained in which the processor 330 is electrically connected with the printed circuit board 310 through the connection 360 and is electrically connected with the interposers 320 through the connection 370. Thereafter, in the same manner as described above, the electronic device 300 is obtained by mounting the memories 340 on the interposers 320 as in FIG. 20C.

As illustrated in FIGS. 21 to 23, in the steps of the bonding process, the bumps 360a may be formed on either the printed circuit board 310 or the processor 330. In addition, in the steps of the bonding process, the bumps 370a may be formed on either the interposers 320 or the processor 330. This may be equally applied to the bumps 350a bonding the printed circuit board 310 and the interposers 320 together. In the steps of the bonding process, the bumps 350a may be formed on either the printed circuit board 310 or the interposers 320. This may be equally applied to bumps bonding the interposers 320 and the memories 340.

The examples of using the posts 361 and the solders 362 (the bumps 360a) to bond the processor 330 and the printed circuit board 310 together have been illustrated above. Besides, when the number of bonding portions between the processor 330 and the printed circuit board 310 is one or more, depending on pitches of the bonding portions, the processor 330 and the printed circuit board 310 may be bonded together by means of bumps such as solders having a relatively large diameter, without being limited to the posts 361.

Next, a third embodiment will be described.

Figure 24:
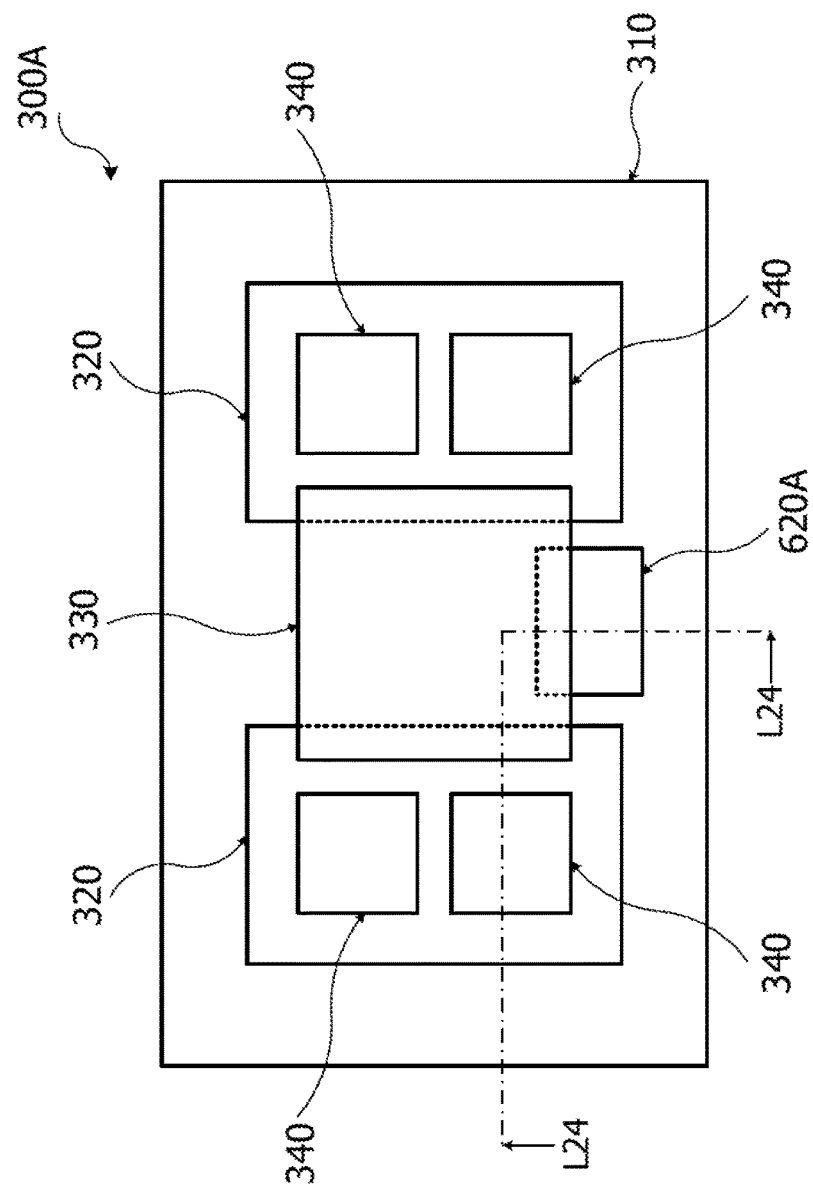
FIG. 24 is a view illustrating one example of an electronic device according to a third embodiment (Part 1)
Figure 25:
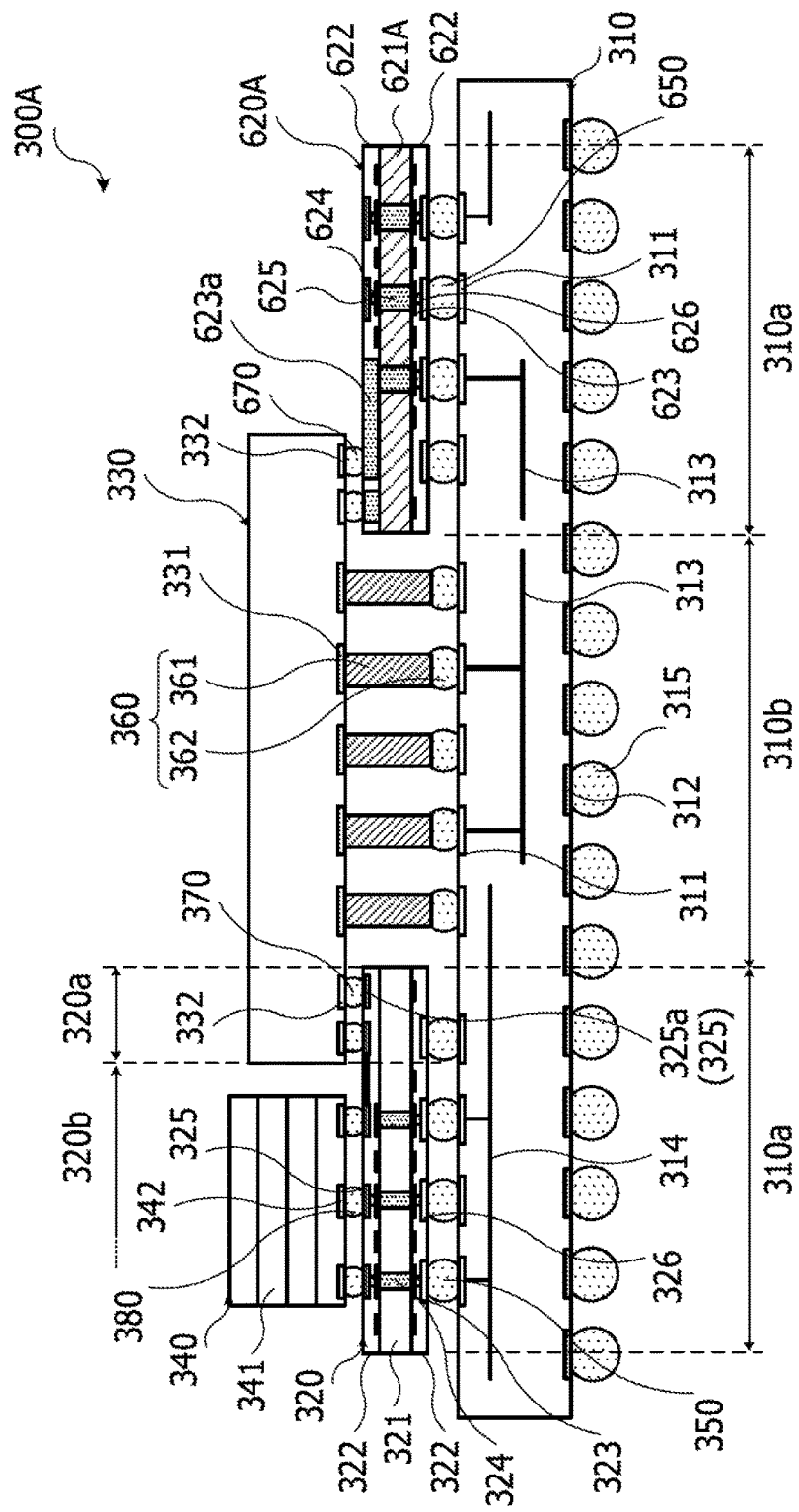
FIG. 25 is a view illustrating one example of the electronic device according to the third embodiment (Part 2)

FIGS. 24 and 25 are views illustrating one example of an electronic device according to a third embodiment. FIG. 24 is a schematic plan view of main parts of one example of the electronic device according to the third embodiment. FIG. 25 is a schematic cross-sectional view of main parts of one example of the electronic device according to the third embodiment. FIG. 25 schematically illustrates a section taken along line L24-L24 in FIG. 24.

The electronic device 300A illustrated in FIGS. 24 and 25 is different from the electronic device 300 according to the second embodiment in that the former further includes an interposer 620A (relay board) in addition to the interposers 320.

In the electronic device 300A, for example, each of the interposers 320 is a Si interposer including a base member 321 made of Si, and the interposer 620A is an organic interposer including a base member 621A made of organic material.

The interposer 620A includes the base member 621A made of an organic material, and wiring layers 622 respectively located on the front and rear surfaces of the base member 621A. Conductors 623 respectively formed in the wiring layers 622 of the front and rear surfaces are electrically interconnected by vias 624 formed to penetrate through the base member 621A. Electrodes (pads) 625 and electrodes (pads) 626 are formed on the front and rear surfaces of the interposers 320, respectively. The vias 624 of the interposer 620A are larger in diameter than the vias 324 of the interposers 320 made of Si. Relatively thick wirings 623a are included in the conductors 623. The wirings 623a are electrically connected with the vias 624. The interposer 620A having the wirings 623a may be obtained, for example, by using a method of patterning a wiring board with a rolled copper foil by means of a subtractive method.

The electrodes 626 of the interposer 620A are electrically connected with the electrodes 311 of the printed circuit board 310 through connections 650. The electrodes 332 of the processor 330 are electrically connected with the thick wirings 623a of the interposer 620A through a connection 670. The thick wirings 623a of the interposer 620A are electrically connected with power lines 313 of the printed circuit board 310 through the vias 624, the connections 650, and the electrodes 311.

In the electronic device 300A including such an interposer 620A, power may be supplied from the printed circuit board 310 to the processor 330 through the relatively large-diameter vias 624 and relatively thick wirings 623a of the interposer 620A. Even when sufficient power may not be supplied from the printed circuit board 310 to the processor 330 through the interposers 320 having the relatively fine conductors 323 and vias 324 formed thereon, sufficient power may be supplied to the processor 330 through the interposer 620A.

Semiconductor devices such as memories, processors and so on may be mounted on the interposer 620A made of an organic material by using the electrodes 625.

The electronic device 300A formed by adding the interposer 620A made of an organic material to the electronic device 300 has been illustrated above. Besides, in the electronic device 300 or the electronic device 300A, at least one of a pair of interposers 320 may be replaced with the interposer 620A.

Next, a fourth embodiment will be described.

Figure 26:
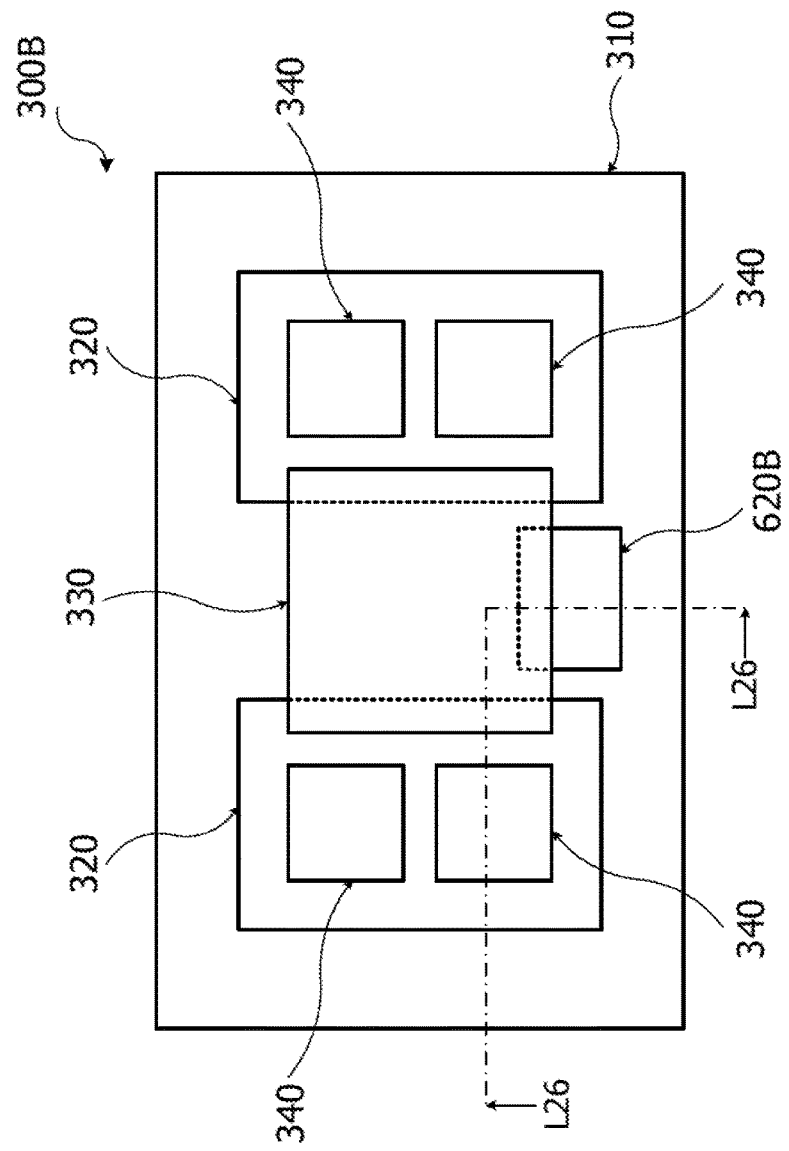
FIG. 26 is a view illustrating one example of an electronic device according to a fourth embodiment (Part 1)
Figure 27:
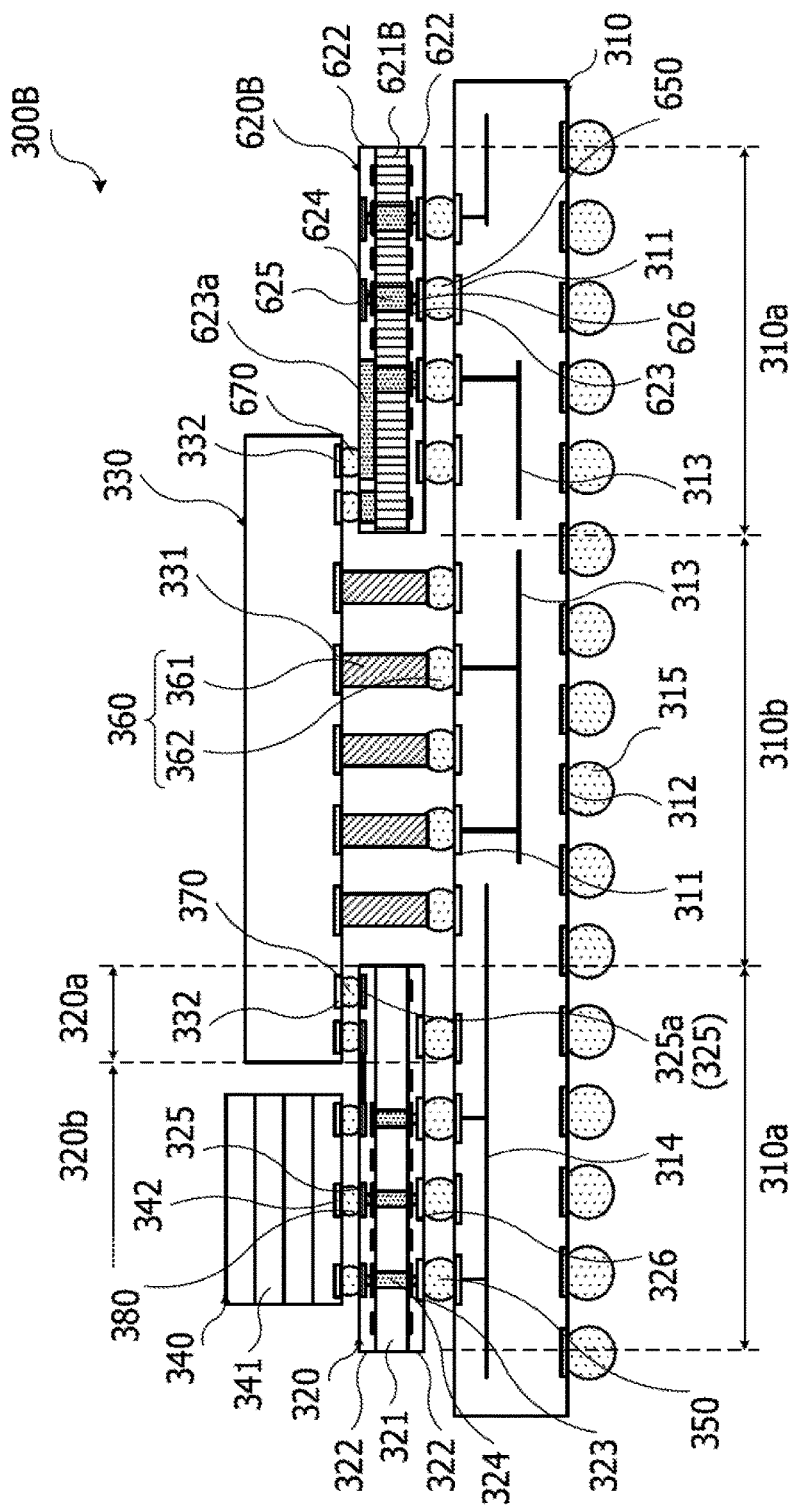
FIG. 27 is a view illustrating one example of the electronic device according to the fourth embodiment (Part 2)

FIGS. 26 and 27 are views illustrating one example of an electronic device according to a fourth embodiment. FIG. 26 is a schematic plan view of main parts of one example of the electronic device according to the fourth embodiment. FIG. 27 is a schematic cross-sectional view of main parts of one example of the electronic device according to the fourth embodiment. FIG. 27 schematically illustrates a section taken along line L26-L26 in FIG. 26.

The electronic device 300B illustrated in FIGS. 26 and 27 is different from the electronic device 300 according to the second embodiment in that the former further includes an interposer 620B (relay board) in addition to interposers 320.

In the electronic device 300B, for example, each of the interposers 320 is a Si interposer including a base member 321 made of Si and the interposer 620B is a glass interposer including a base member 621B made of glass. Other configurations of the interposer 620B are the same as, e.g., those of the interposer 620A described in the third embodiment.

While the resistivity of the organic material is about $10^7 \Omega cm$ to about $10^9 \Omega cm$, the resistivity of glass is about $10^{12} \Omega cm$. In addition, glass has a higher insulating property than the organic material. Therefore, the interposer 620B including the base member 621B made of glass is capable of reducing a loss in signal transmission. According to the electronic device 300B including such an interposer 620B, fast signal transmission, e.g., at a rate of 25 GHz or more may be achieved.

Semiconductor devices such as memories, processors and so on may be mounted on the interposer 620B made of glass.

The electronic device 300B formed by adding the interposer 620B made of glass to the electronic device 300 has been illustrated above. Besides, in the electronic device 300 or the electronic device 300B, at least one of a pair of interposers 320 may be replaced with the interposer 620B.

Next, a fifth embodiment will be described.

Figure 28:
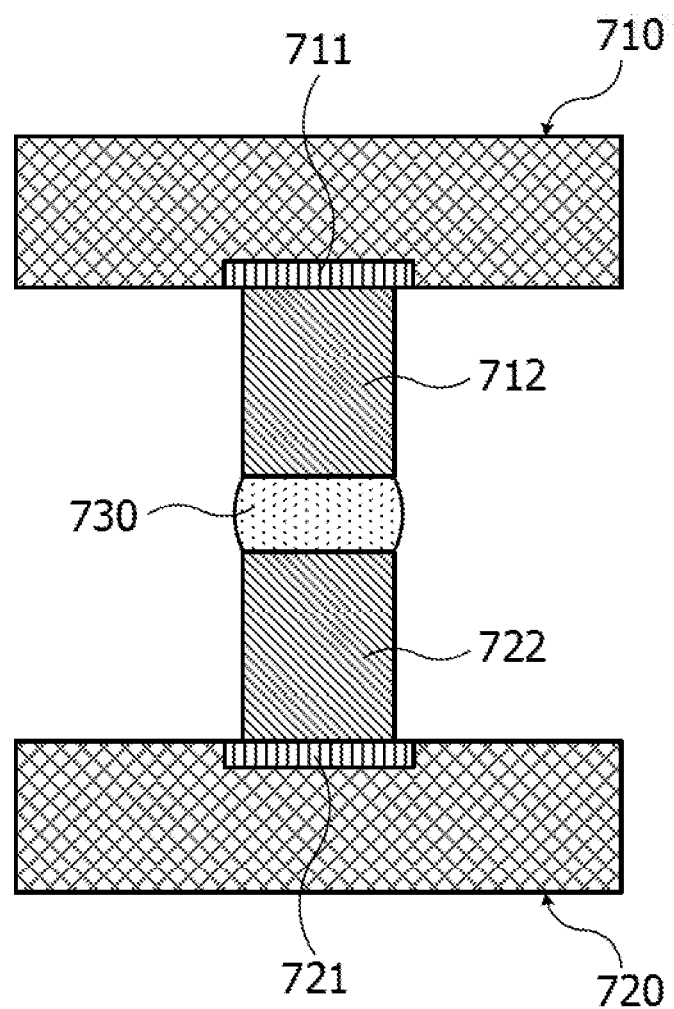
FIG. 28 is a view illustrating one example of an inter-electronic component connection according to a fifth embodiment.

FIG. 28 is a view illustrating one example of an inter-electronic component connection according to a fifth embodiment. FIG. 28 is a schematic cross-sectional view of main parts of one example of the inter-electronic component connection according to the fifth embodiment.

FIG. 28 illustrates one example of a connection between an electronic component 710 and an electronic component 720. The upper electronic component 710 includes an electrode 711 electrically connected with an internal circuit element, and a post 712 formed on the electrode 711. The lower electronic component 720 includes an electrode 721 electrically connected with an internal circuit element, and a post 722 formed on the electrode 721. The post 712 of the upper electronic component 710 and the post 722 of the lower electronic component 720 face with other and are together bonded by a solder 730.

The connection structure as illustrated in FIG. 28 where the post 712 of the upper electronic component 710 and the post 722 of the lower electronic component 720 are bonded together by the solder 730 may be employed in the electronic devices 1, 1A, 1B, 1C, 300, 300A and 300B described in the above first to fourth embodiments.

For example, in the electronic device 300 according to the second embodiment, a connection between the processor 330 and the printed circuit board 310 is assumed as a structure where the posts 361 of the processor 330 and the posts formed on the electrode 311 of the printed circuit board 310 are bonded together by a solder, according to the example of FIG. 28. A connection between the processor 330 and the interposer 320 is assumed as a structure where the posts formed on the electrodes 332 of the processor 330 and the posts formed on the electrodes 325a of the interposer 320 are together bonded by a solder, according to the example of FIG. 28.

A connection between the interposer 320 and the printed circuit board 310 is assumed as a structure where the posts formed on the electrodes 326 of the interposer 320 and the posts formed on the electrodes 311 of the printed circuit board 310 are bonded together by a solder, according to the example of FIG. 28. A connection between the memories 340 and the interposer 320 is assumed as a structure where the posts formed on the electrodes 342 of the memories 340 and the posts formed on the electrodes 325 of the interposer 320 are bonded together by a solder, according to the example of FIG. 28. At least one of these connection structures may be employed in the electronic device 300.

The structure as illustrated in FIG. 28 may be employed for the connection between the semiconductor element 30, the circuit board 10 and the circuit board 20, the connection between the circuit board 20 and the circuit board 10 and the connection between the semiconductor element 70 and the circuit board 20 of the above electronic devices 1, 1A, 1B and 1C (FIGS. 1 to 5). Similarly, the structure as illustrated in FIG. 28 may be employed in the connection between the semiconductor element 30 and the circuit board 20B, the connection between the circuit board 20B and the circuit board 10 and the connection between the semiconductor element 70B and the circuit board 20B of the above electronic device 1B (FIG. 4). Similarly, the structure as illustrated in FIG. 28 may be employed for the connection between the semiconductor element 30C, the circuit board 10 and the circuit board 20 of the above electronic device 1C (FIG. 5).

In addition, similarly, the structure as illustrated in FIG. 28 may be employed for the connection between the processor 330 and the interposer 620A and the connection between the interposer 620A and the printed circuit board 310 of the above electronic device 300A (FIGS. 24 and 25). Similarly, the structure as illustrated in FIG. 28 may be employed for the connection between the processor 330 and the interposer 620B and the connection between the interposer 620B and the printed circuit board 310 of the above electronic device 300B (FIGS. 26 and 27).

By employing the connection structure as illustrated in FIG. 28, narrow pitches of terminals, the increase number of terminals (multiplexed pin), and high performance obtained thereby may be achieved.

As described above, the electronic devices 1, 1A, 1B, 1C, 300, 300A, and 300B described in the first to fifth embodiments may be employed in various kinds of electronic apparatuses, such as, for example, personal computers, super computers, servers, smartphones, mobile phones, tablet terminals, cameras, audio systems, measuring instruments, inspection equipment, manufacturing apparatuses, and so on.

Figure 29:
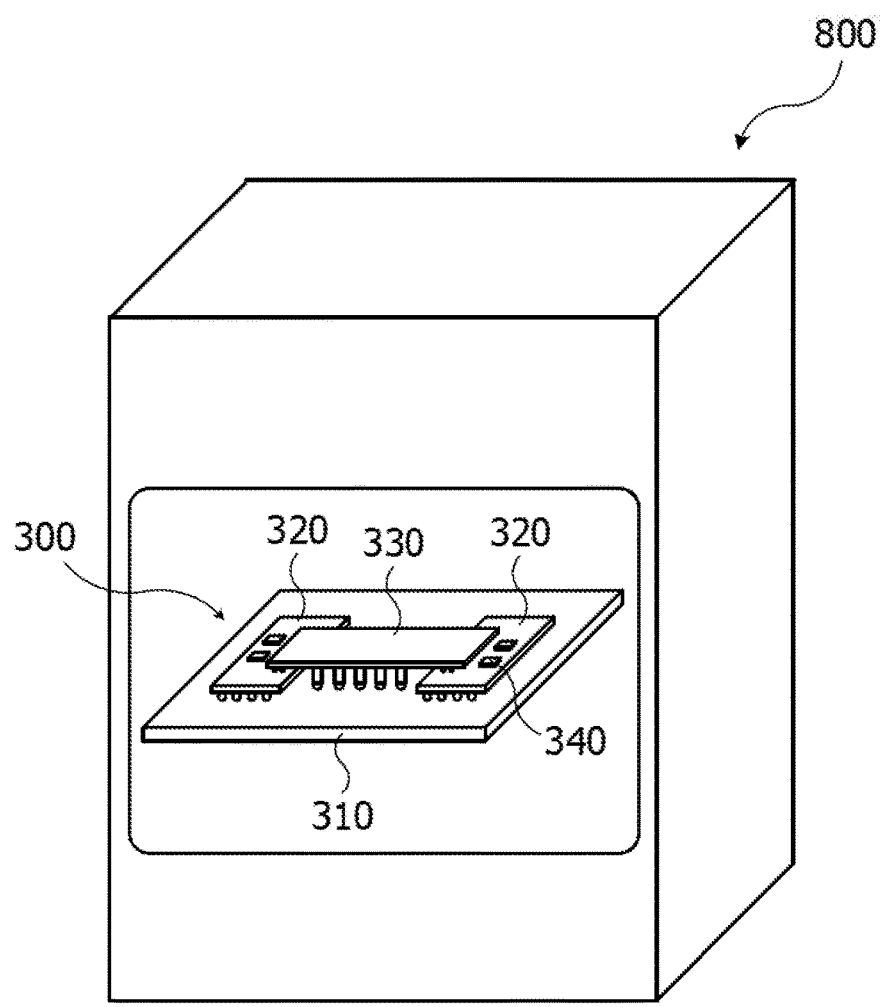
FIG. 29 is a view illustrating one example of an electronic apparatus.

FIG. 29 illustrates one example of an electronic apparatus. FIG. 29 schematically illustrates one example of a server 800 equipped with the electronic device 300 described in the second embodiment. Similarly, the server 800 may be equipped with other electronic devices 1, 1A, 1B, 1C, 300A, and 300B. In addition to the server 800, other different kinds of electronic apparatuses may be equipped with the electronic devices 1, 1A, 1B, 1C, 300, 300A, and 300B.

By mounting electronic devices employing the techniques described in the above first to fifth embodiments, various electronic apparatuses capable of sufficiently exhibiting the performance of semiconductor elements to be used, such as a processor, a memory and so on may be realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing an electronic device, comprising:
    disposing a second circuit board above a first region of a first circuit board;
    disposing a first semiconductor element above a second region of the first circuit board, which is different from the first region, and above a third region of the second circuit board;
    electrically interconnecting the first semiconductor element and the first circuit board by a first connection interposed between the first semiconductor element and the second region; and
    electrically interconnecting the first semiconductor element and the second circuit board by a second connection interposed between the first semiconductor element and the third region,
    wherein the electrically interconnecting the first semiconductor element and the first circuit board by the first connection and the electrically interconnecting the first semiconductor element and the second circuit board by the second connection are performed simultaneously.

2. The method according to claim 1, further comprising:
    disposing a second semiconductor element above a fourth region of the second circuit board, which is different from the third region; and
    electrically interconnecting the second semiconductor element and the second circuit board a third connection interposed between the second semiconductor element and the fourth region.

3. The method according to claim 1, further comprising:
    disposing a third circuit board above the first circuit board; and
    electrically interconnecting the first semiconductor element located above a portion of the third circuit board, and the third circuit board by a fifth connection interposed between the first semiconductor element and the portion of the third circuit board.

4. The method according to claim 1, further comprising:
    electrically interconnecting the second circuit board and the first circuit board by a fourth connection interposed between the second circuit board and the first region.

5. An electronic apparatus comprising:
    an electronic device including:
    a first circuit board;
    a second circuit board located above a first region of the first circuit board;
    a first semiconductor element located above a second region of the first circuit board, which is different from the first region, and above a third region of the second circuit board;
    a first connection interposed between the first semiconductor element and the second region so as to electrically interconnect the first semiconductor element and the first circuit board; and
    a second connection interposed between the first semiconductor element and the third region so as to electrically interconnect the first semiconductor element and the second circuit board,
    wherein the first connection includes post electrodes,
    the second circuit board includes via electrodes that penetrate through the second circuit board, and
    a diameter of each of the post electrodes is larger than a diameter of each of the via electrodes.

6. An electronic device comprising:
    a first circuit board;
    a second circuit board located above a first region of the first circuit board;
    a first semiconductor element located above a second region of the first circuit board, which is different from the first region, and above a third region of the second circuit board;
    a first connection interposed between the first semiconductor element and the second region so as to electrically interconnect the first semiconductor element and the first circuit board; and
    a second connection interposed between the first semiconductor element and the third region so as to electrically interconnect the first semiconductor element and the second circuit board,
    wherein the first connection includes post electrodes,
    the second circuit board includes via electrodes that penetrate through the second circuit board, and
    a diameter of each of the post electrodes is larger than a diameter of each of the via electrodes.

7. The electronic device according to claim 6, further comprising:
    a third circuit board located above the first circuit board, and partially interposed between the first circuit board and the first semiconductor element; and
    a fifth connection interposed between the first semiconductor element and the portion of the third circuit board so as to electrically interconnect the first semiconductor element and the third circuit board.

8. The electronic device according to claim 6, further comprising:
    a second semiconductor element located above a fourth region of the second circuit board, which is different from the third region; and
    a third connection interposed between the second semiconductor element and the fourth region so as to electrically interconnect the second semiconductor element and the second circuit board,
    wherein the first semiconductor element and the second semiconductor element are electrically interconnected through the second connection, the second circuit board, and the third connection.

9. The electronic device according to claim 6, further comprising:
    a fourth connection interposed between the second circuit board and the first region so as to electrically interconnect the second circuit board and the first circuit board.

* * * * *